(12) United States Patent
Okabe et al.

(10) Patent No.: US 12,089,444 B2
(45) Date of Patent: Sep. 10, 2024

(54) DISPLAY DEVICE AND METHOD FOR MANUFACTURING SAME

(71) Applicant: SHARP KABUSHIKI KAISHA, Sakai (JP)

(72) Inventors: Tohru Okabe, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 527 days.

(21) Appl. No.: 17/432,406

(22) PCT Filed: Feb. 27, 2019

(86) PCT No.: PCT/JP2019/007544
§ 371 (c)(1),
(2) Date: Aug. 19, 2021

(87) PCT Pub. No.: WO2020/174605
PCT Pub. Date: Sep. 3, 2020

(65) Prior Publication Data
US 2022/0344423 A1    Oct. 27, 2022

(51) Int. Cl.
*H10K 59/121* (2023.01)
*H01L 29/786* (2006.01)
*H10K 59/12* (2023.01)
*H10K 59/131* (2023.01)

(52) U.S. Cl.
CPC ..... *H10K 59/1213* (2023.02); *H01L 29/7869* (2013.01); *H01L 29/78696* (2013.01); *H10K 59/131* (2023.02); *H10K 59/1201* (2023.02)

(58) Field of Classification Search
CPC .............. H10K 59/1213; H10K 59/131; H01L 29/7869; H01L 29/78696
See application file for complete search history.

(56) References Cited

U.S. PATENT DOCUMENTS

| | | | |
|---|---|---|---|
| 6,617,644 B1 | 9/2003 | Yamazaki et al. | |
| 7,279,711 B1 | 10/2007 | Yamazaki et al. | |
| 9,443,876 B2 * | 9/2016 | Yamazaki | H01L 27/14612 |
| 9,627,585 B2 * | 4/2017 | Okumoto | H01L 33/42 |
| 9,859,304 B2 * | 1/2018 | Sun | H01L 21/32139 |

(Continued)

FOREIGN PATENT DOCUMENTS

| | | |
|---|---|---|
| JP | 2000-216396 A | 8/2000 |
| JP | 2007-072452 A | 3/2007 |

(Continued)

*Primary Examiner* — Kyoung Lee
*Assistant Examiner* — Sophia W Kao
(74) *Attorney, Agent, or Firm* — ScienBiziP, P.C.

(57) ABSTRACT

In a TFT layer forming step, first, a semiconductor layer on a resin substrate is formed by performing a semiconductor layer forming step, and subsequently a gate insulating film is formed to cover the semiconductor layer by performing a gate insulating film forming step, and then a first metal layer is formed by performing a first metal film deposition step, a first photo step, and a first etching step, and a second metal layer is formed by performing a second metal film deposition step, a second photo step, and a second etching step, thereby forming a gate layer in which the first metal layer and the second metal layer are layered.

9 Claims, 33 Drawing Sheets

(56) References Cited

U.S. PATENT DOCUMENTS

| | | | |
|---|---|---|---|
| 2004/0051142 A1* | 3/2004 | Yamazaki | H01L 29/78621 257/347 |
| 2006/0081931 A1 | 4/2006 | Yamazaki et al. | |
| 2007/0037070 A1 | 2/2007 | Ohnuma et al. | |
| 2008/0048189 A1 | 2/2008 | Yamazaki et al. | |
| 2010/0187532 A1* | 7/2010 | Nagano | H01L 27/1288 438/30 |
| 2011/0170084 A1 | 7/2011 | Ohnuma et al. | |
| 2011/0241012 A1 | 10/2011 | Yamazaki et al. | |
| 2014/0138637 A1 | 5/2014 | Yang et al. | |
| 2015/0028340 A1* | 1/2015 | Iwasaka | H01L 27/124 438/158 |
| 2015/0221678 A1 | 8/2015 | Yamazaki et al. | |
| 2016/0336352 A1 | 11/2016 | Yamazaki et al. | |
| 2019/0244981 A1 | 8/2019 | Yamazaki et al. | |
| 2021/0013239 A1 | 1/2021 | Yamazaki et al. | |
| 2021/0257427 A1* | 8/2021 | Kanzaki | H01L 29/66742 |

FOREIGN PATENT DOCUMENTS

| | | |
|---|---|---|
| JP | 2015-179822 A | 10/2015 |
| JP | 2016-503515 A | 2/2016 |

* cited by examiner

DISPLAY DEVICE AND METHOD FOR MANUFACTURING SAME

TECHNICAL FIELD

The disclosure relates to a display device and a method for manufacturing the same.

BACKGROUND ART

In recent years, a self-luminous type organic electroluminescence (hereinafter also referred to as EL) display device using an organic EL element has attracted attention as a display device that can replace liquid crystal display devices. As the organic EL display device, an organic EL display device having flexibility in which an organic EL element, a variety of films, and the like are layered on a flexible resin substrate, has been proposed.

For example, PTL 1 discloses a flexible display with a redundancy design including a pair of sinusoidal metal wiring lines being out of phase by approximately 180 degrees from each other.

CITATION LIST

Patent Literature

PTL 1: JP 2016-503515 T

SUMMARY

Technical Problem

In a case where, in a flexible display device, wiring lines are formed by a refractory metal such as molybdenum and titanium, in a case where a metal film formed of a refractory metal is formed on a gate insulating film, for example, a crack may occur in the gate insulating film due to a high stress generated in the metal film. As a result, since the wiring lines formed by patterning the metal film formed of the refractory metal break and moisture penetrates through the crack formed in the gate insulating film, a production yield is reduced or reliability of the display device is reduced. On the other hand, since the electrical resistivity of the refractory metal is relatively high, the film thickness needs to be increased in order to reduce wiring line resistance. However, in a case where the film thickness of the metal film formed of the refractory metal is increased, a stress generated in the metal film increases, so that the above-described crack of the gate insulating film is likely to occur. Thus, reducing the wiring line resistance of the wiring lines using the refractory metal and suppressing the occurrence of the crack in the gate insulating film are in a tradeoff relationship.

The disclosure has been made in light of the foregoing point, and an object of the disclosure is to suppress the occurrence of the crack in the gate insulating film and reduce the wiring line resistance.

Solution to Problem

In order to achieve the above-described object, a method for manufacturing a display device according to the disclosure includes a thin film transistor layer forming step of forming, on a resin substrate, a thin film transistor layer provided with a thin film transistor for each of subpixels, and a light-emitting element layer forming step of forming, on the thin film transistor layer, a light-emitting element layer provided with a light-emitting element for each of the subpixels, wherein the thin film transistor layer forming step includes a semiconductor layer forming step of forming a semiconductor film on the resin substrate and subsequently patterning the semiconductor film to form a semiconductor layer, a gate insulating film forming step of forming a gate insulating film to cover the semiconductor layer, a first metal film deposition step of depositing a first metal film to cover the gate insulating film, a first photo step of applying a resist on the first metal film and subsequently exposing the resist using a first mask to form a first resist pattern, a first etching step of etching the first metal film exposed from the first resist pattern to form a first metal layer, and a first peeling step of peeling the first resist pattern used in the first etching step, a second metal film deposition step of forming a second metal film to cover the first metal layer exposed by peeling the first resist pattern, a second photo step of applying a resist on the second metal film and subsequently exposing the resist using a second mask to form a second resist pattern, a second etching step of etching the second metal film exposed from the second resist pattern to form a second metal layer and forming a gate layer in which the first metal layer and the second metal layer are layered, and a second peeling step of peeling the second resist pattern used in the second etching step.

A display device according to the disclosure includes a resin substrate, a thin film transistor layer provided on the resin substrate and including a thin film transistor arranged for each of subpixels, and a light-emitting element layer provided on the thin film transistor layer and including a light-emitting element arranged for each of the subpixels, wherein a semiconductor layer, a gate insulating film, and a gate layer are sequentially provided as the thin film transistor layer on the resin substrate, the gate layer includes a first metal layer provided on the gate insulating film and a second metal layer provided on the first metal layer, the semiconductor layer includes an intrinsic region provided to overlap with the gate layer and a pair of conductor regions provided with the intrinsic region interposed therebetween, portions of the intrinsic region are provided with respective offset regions, the portions being respective sides with the pair of conductor regions, not to overlap with the first metal layer and the second metal layer, and a length of the second metal layer is equal to or less than a length of the first metal layer in a direction of a channel length of the semiconductor layer.

A display device according to the disclosure includes a resin substrate, a thin film transistor layer provided on the resin substrate and including a thin film transistor arranged for each of subpixels, and a light-emitting element layer provided on the thin film transistor layer and including a light-emitting element arranged for each of the subpixels, wherein a semiconductor layer formed of low-temperature polysilicon, a gate insulating film, and a gate layer are sequentially provided as the thin film transistor layer on the resin substrate, the gate layer includes a first metal layer provided on the gate insulating film and a second metal layer provided on the first metal layer, the semiconductor layer includes an intrinsic region provided to overlap with the first metal layer and a pair of conductor regions provided with the intrinsic region interposed therebetween, boundaries between the pair of conductor regions and the intrinsic region are provided to align with end portions of the first metal layer, in the gate layer overlapping with the intrinsic region, the second metal layer is provided to protrude from both end portions of the first metal layer to cover the first metal layer in a direction of a channel length of the semiconductor layer, and the gate layer that does not overlap with the semiconductor layer includes, in the gate layer, a portion in which a width of the second metal layer is equal to or less than a width of the first metal layer.

A display device according to the disclosure includes a resin substrate, a thin film transistor layer provided on the resin substrate and including a thin film transistor arranged for each of subpixels, and a light-emitting element layer provided on the thin film transistor layer and including a light-emitting element arranged for each of the subpixels, wherein a semiconductor layer, a gate insulating film, and a gate layer are sequentially provided as the thin film transistor layer on the resin substrate, the thin film transistor includes a first thin film transistor and a second thin film transistor, the semiconductor layer includes a first semiconductor layer and a second semiconductor layer provided to correspond to the first thin film transistor and the second thin film transistor, the gate layer includes a first gate layer and a second gate layer provided to correspond to the first thin film transistor and the second thin film transistor, the first gate layer and the second gate layer respectively include a first metal layer provided on the gate insulating film and a second metal layer provided on the first metal layer, the first semiconductor layer includes a first intrinsic region provided to overlap with the first gate layer and a pair of first conductor regions provided with the first intrinsic region interposed therebetween, offset regions are provided in respective portions of the first intrinsic region, the portions being respective sides with the pair of first conductor regions, not to overlap with the corresponding first metal layer and the second metal layer, boundaries between the pair of first conductor regions and the first intrinsic region are provided to align with a step formed on a surface of the gate insulating film, a length of the corresponding second metal layer is equal to or less than a length of the corresponding first metal layer in a direction of a channel length of the first semiconductor layer, the second semiconductor layer includes a second intrinsic region provided to overlap with the corresponding first metal layer, and a pair of second conductor regions provided with the second intrinsic region interposed therebetween, boundaries between the pair of second conductor regions and the second intrinsic region are provided to align with end portions of the corresponding first metal layer, in the second gate layer overlapping with the second intrinsic region, the corresponding second metal layer is provided to protrude from both end portions of the corresponding first metal layer to cover the first metal layer in a direction of the channel length of the second semiconductor layer, and the second gate layer not overlapping with the second semiconductor layer includes, in the second gate layer, a portion in which a width of the corresponding second metal layer is equal to or less than a width of the corresponding first metal layer.

Advantageous Effects of Disclosure

According to the disclosure, a first metal layer formed by a first metal film deposition step, a first photo step, and a first etching step, and a second metal layer formed by a second metal film deposition step, a second photo step, and a second etching step are layered on a gate insulating film to form a gate layer of a thin film transistor layer, so that occurrence of cracks in the gate insulating film can be suppressed and wiring line resistance of the gate layer can be reduced.

BRIEF DESCRIPTION OF DRAWINGS

FIG. 9 is a view corresponding to FIG. 7.

FIG. 10 is a view corresponding to FIG. 6.

FIG. 11 is a view corresponding to FIG. 6.

FIG. 12 is a view corresponding to FIG. 6.

FIG. 13 is a view corresponding to FIG. 6.

FIG. 14 is a view corresponding to FIG. 6.

FIG. 15 is a view corresponding to FIG. 6.

FIG. 16 is a view corresponding to FIG. 6.

FIG. 17 is a view corresponding to FIG. 6.

FIG. 18 is a view corresponding to FIG. 7.

FIG. 19 is a view corresponding to FIG. 17.

FIG. 20 is a view corresponding to FIG. 17.

FIG. 21 is a view corresponding to FIG. 17.

FIG. 24 is a view corresponding to FIG. 23.

FIG. 25 is a view corresponding to FIG. 23.

FIG. 26 is a view corresponding to FIG. 23.

FIG. 27 is a view corresponding to FIG. 23.

FIG. 28 is a view corresponding to FIG. 23.

FIG. 31 is a view corresponding to FIG. 30.

FIG. 32 is a view corresponding to FIG. 30.

DESCRIPTION OF EMBODIMENTS

Embodiments of the disclosure will be described below in detail with reference to the drawings. Note that the disclosure is not limited to each embodiment to be described below.

First Embodiment

Figure 1:
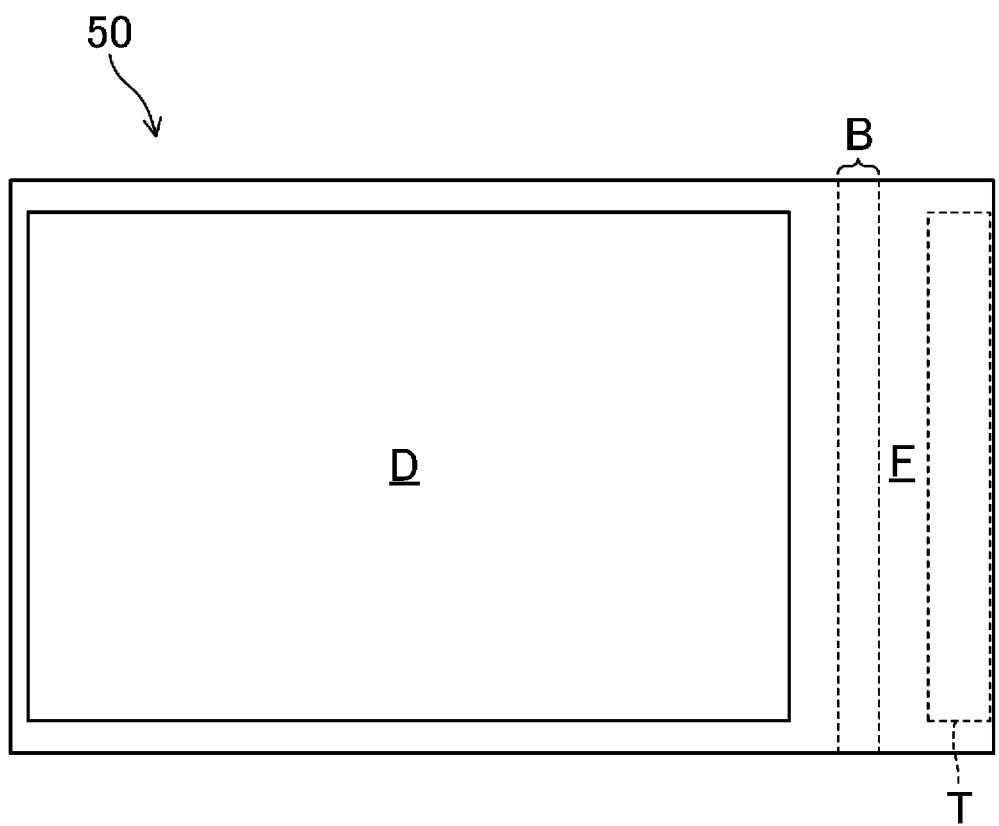
FIG. 1 is a plan view illustrating a schematic configuration of an organic EL display device according to a first embodiment of the disclosure.
Figure 2:
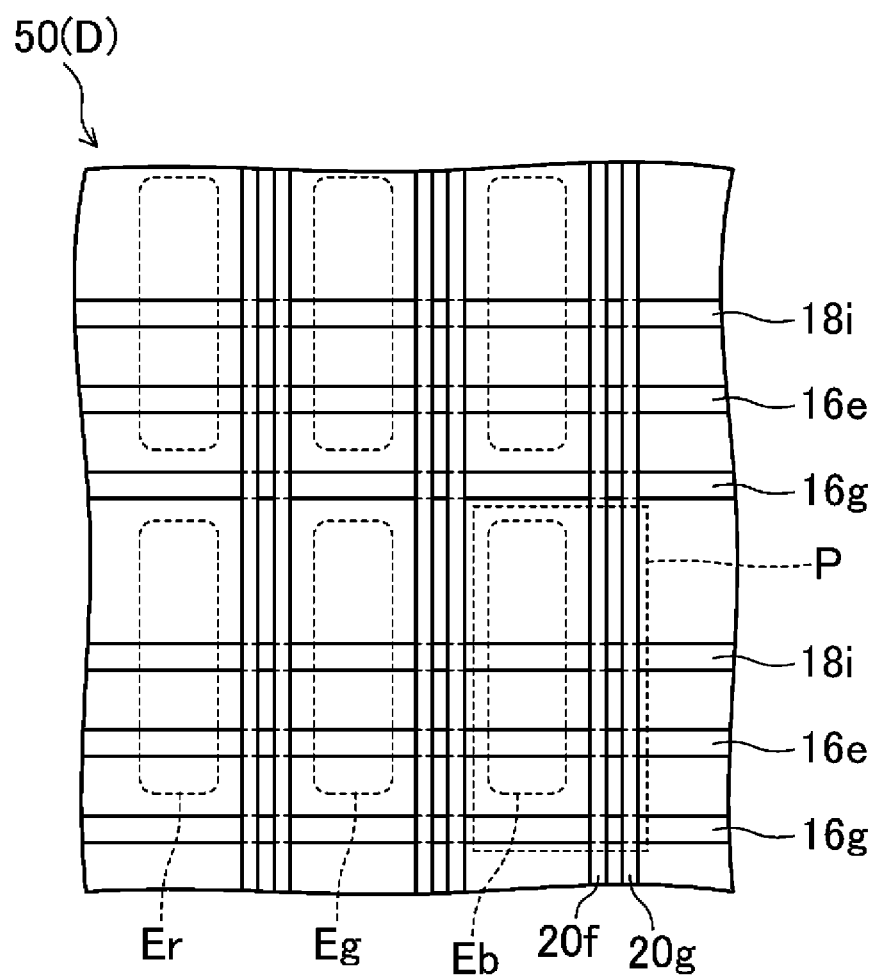
FIG. 2 is a plan view illustrating a schematic configuration of a display region of the organic EL display device according to the first embodiment of the disclosure.
Figure 3:
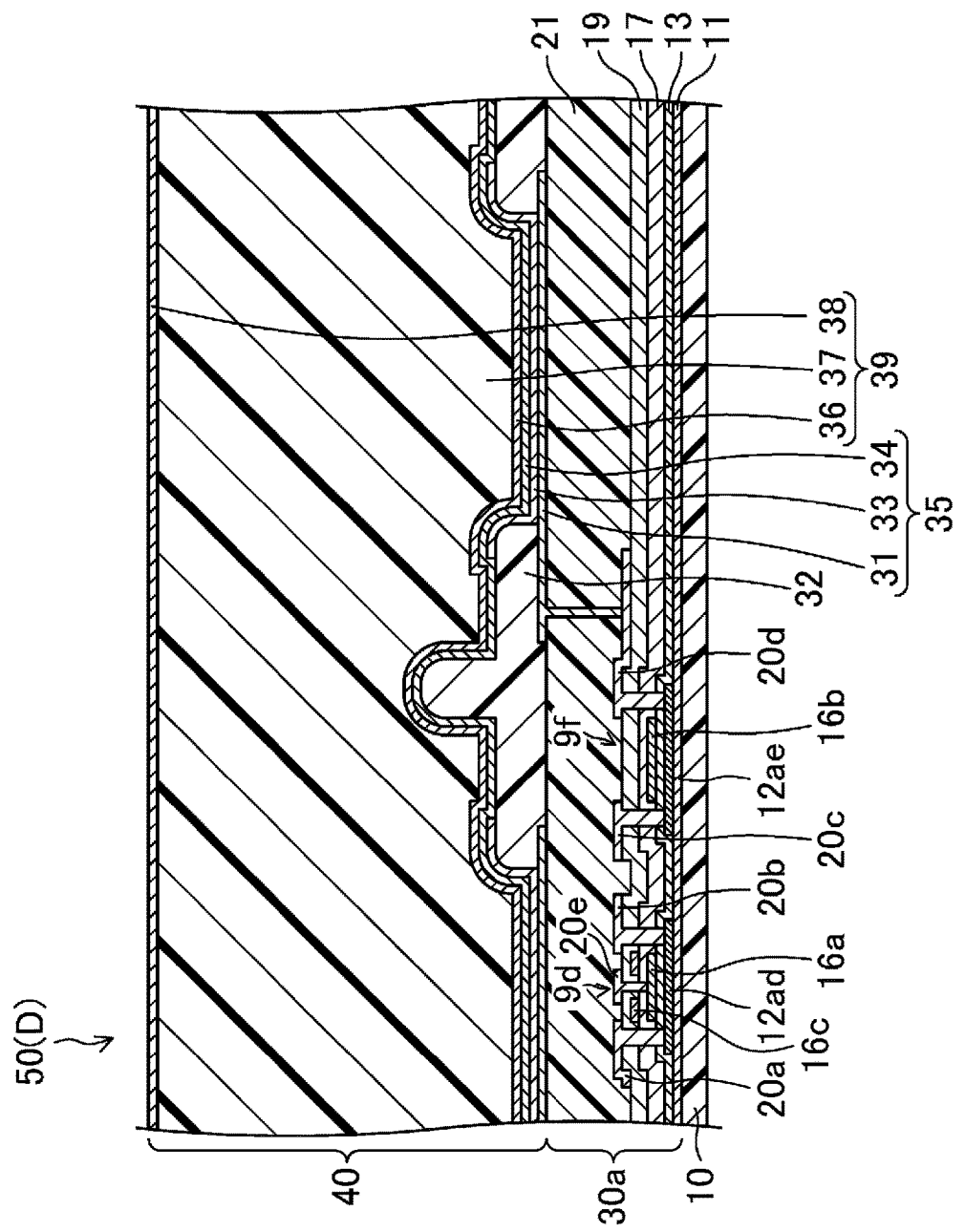
FIG. 3 is a cross-sectional view illustrating, in detail, a configuration of the display region of the organic EL display device according to the first embodiment of the present-invention disclosure.
Figure 4:
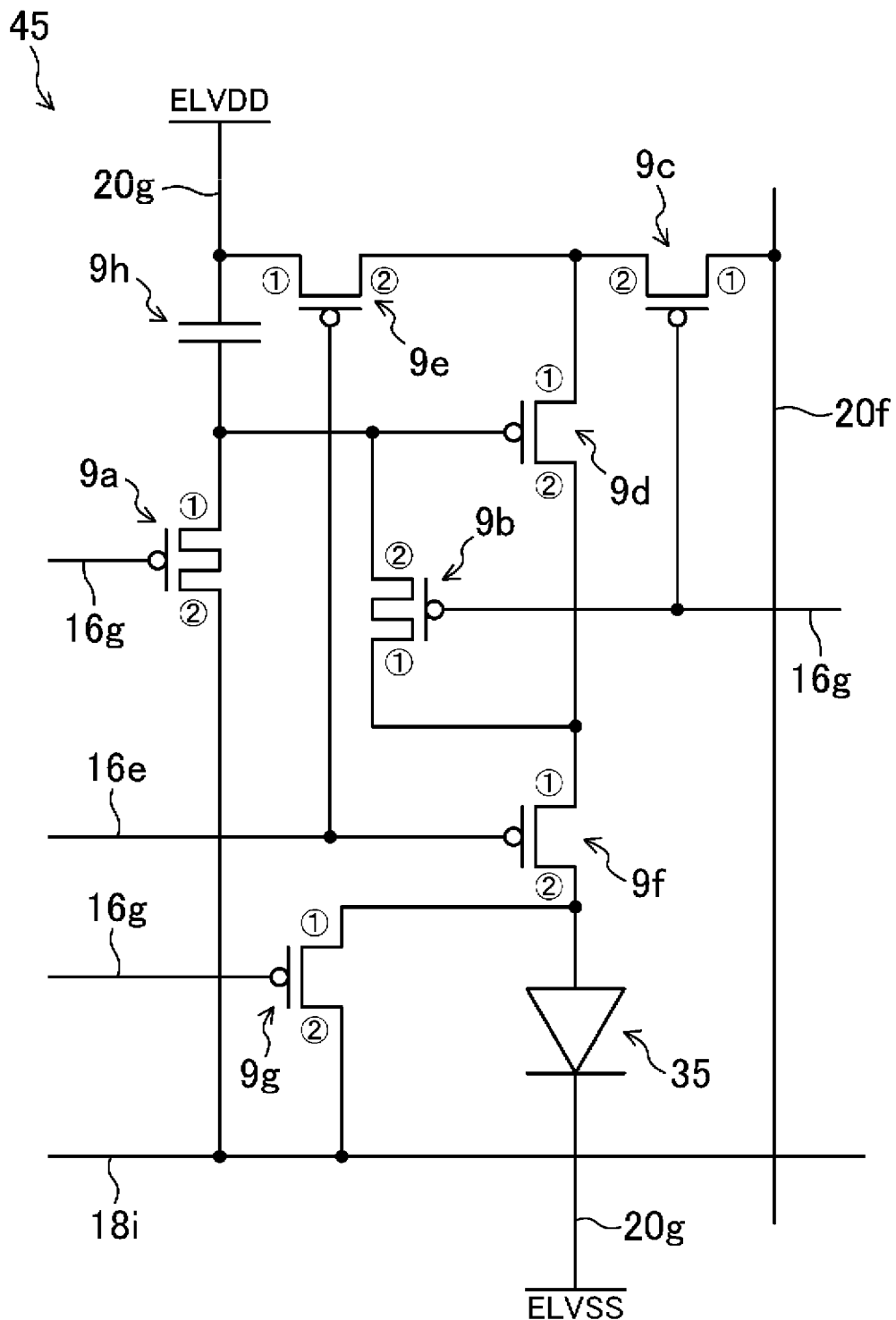
FIG. 4 is an equivalent circuit diagram illustrating a pixel circuit of the organic EL display device according to the first embodiment of the disclosure.
Figure 5:
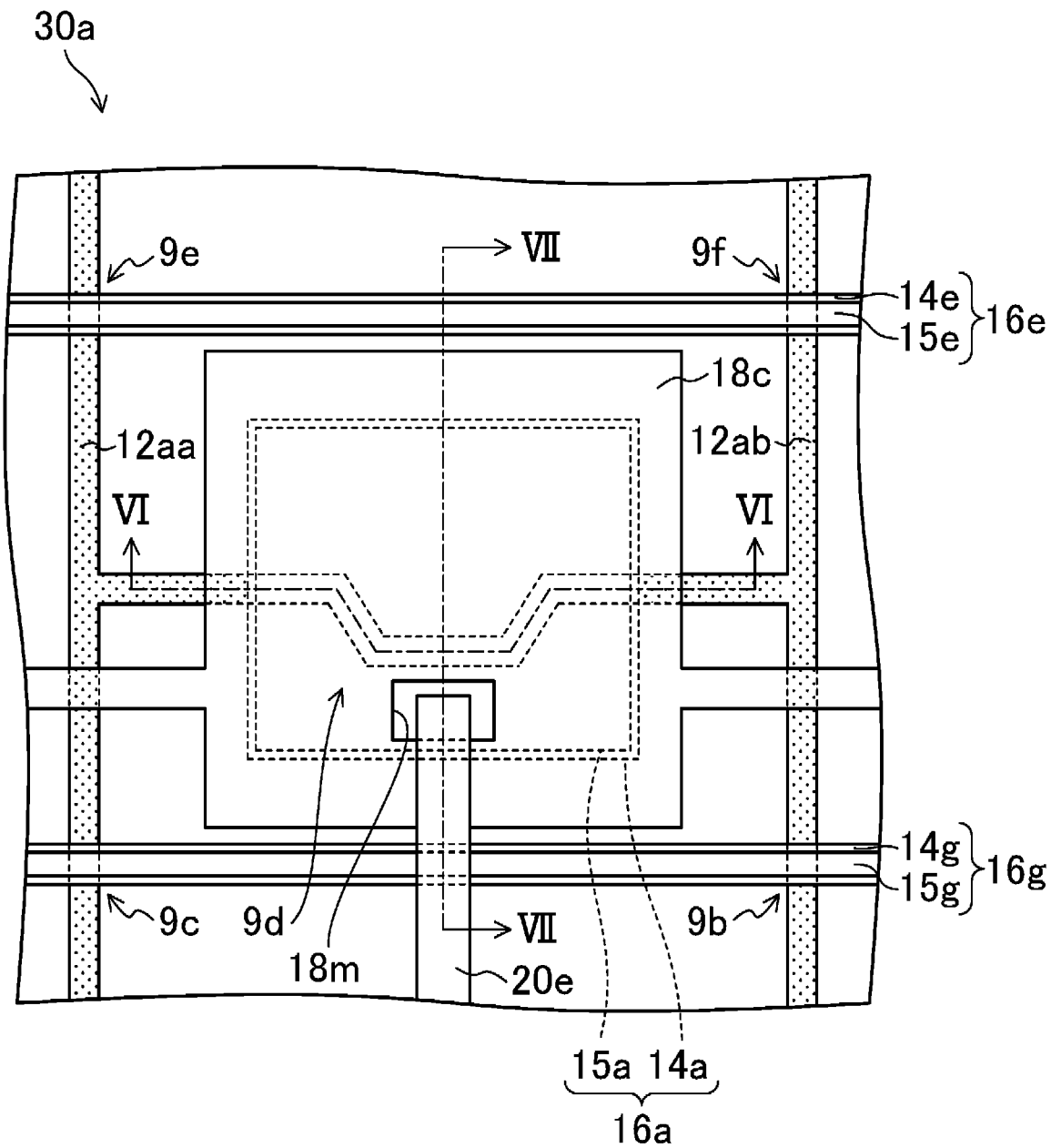
FIG. 5 is a plan view of a TFT layer included in the organic EL display device according to the first embodiment of the disclosure.
Figure 6:
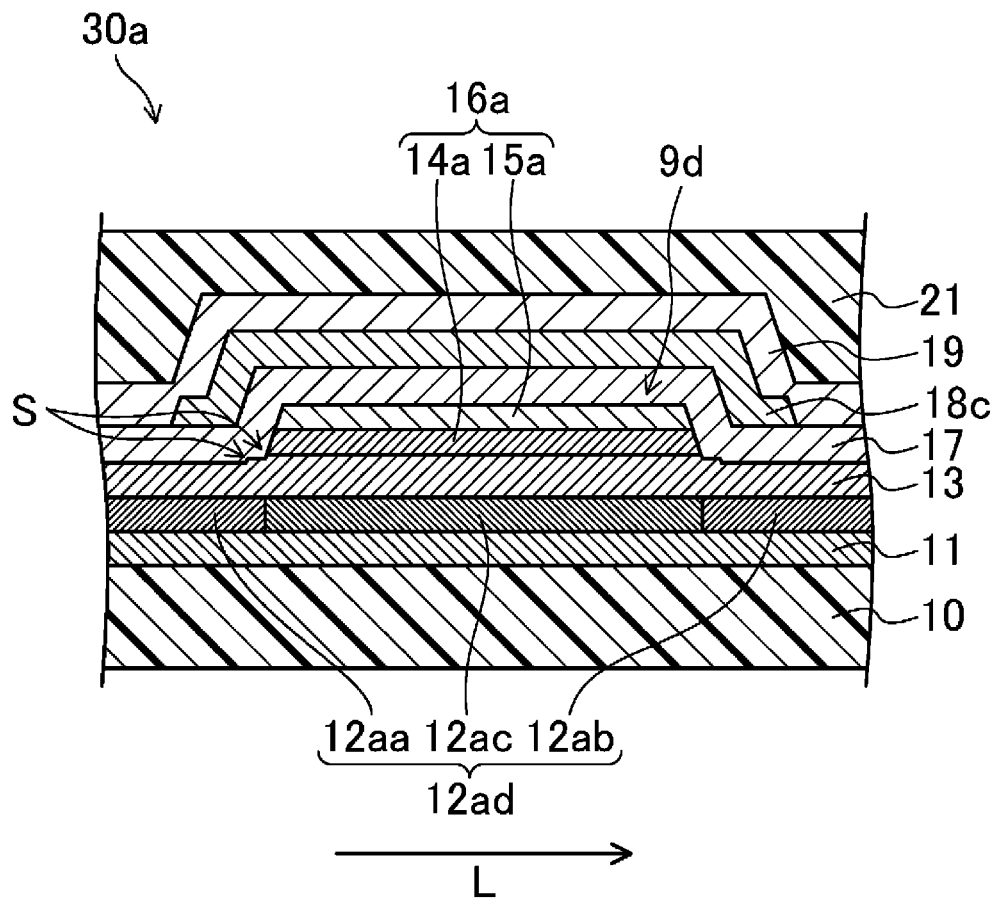
FIG. 6 is a cross-sectional view of the TFT layer taken along a line VI-VI in FIG. 5.
Figure 7:
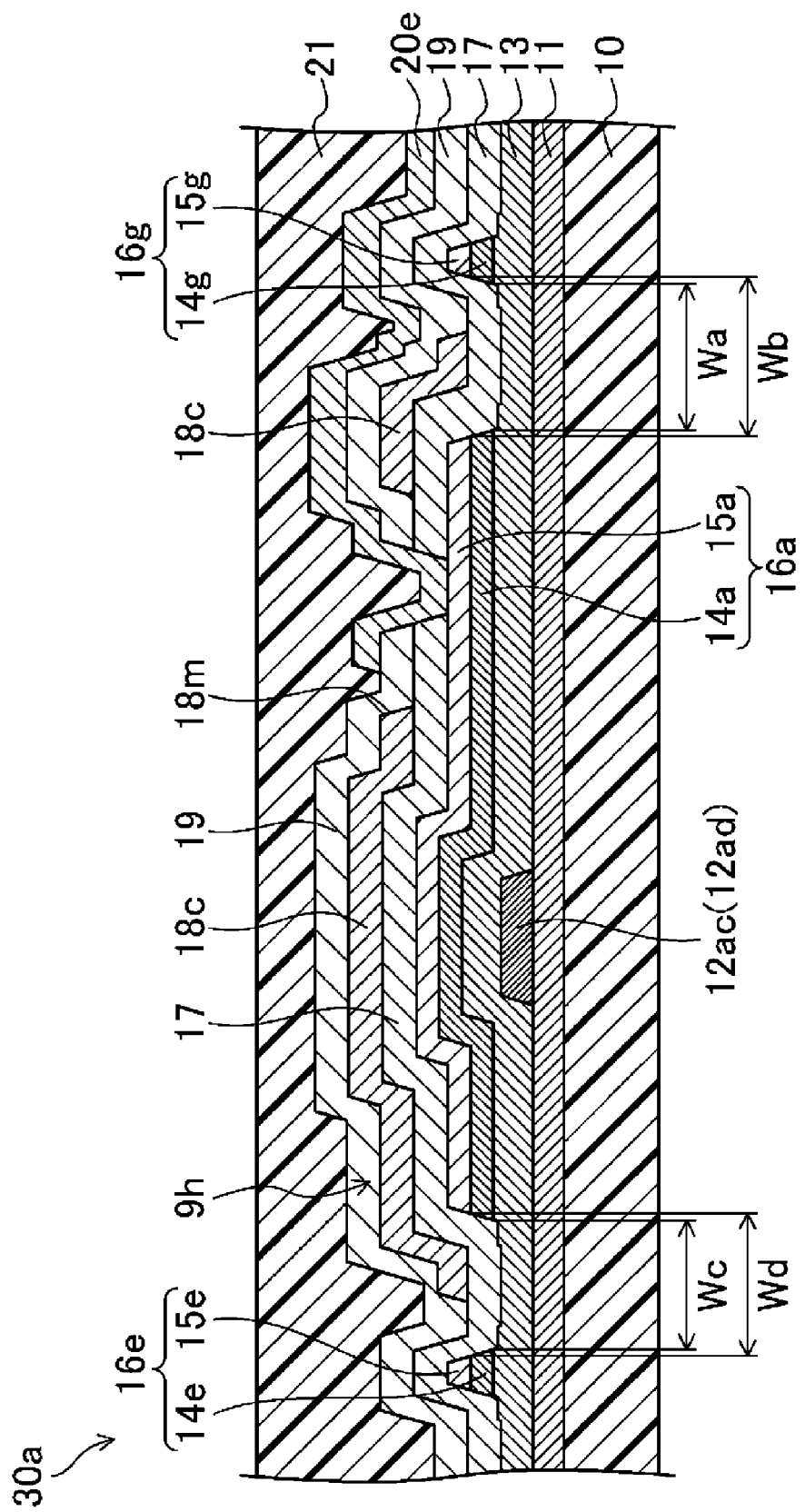
FIG. 7 is a cross-sectional view of the TFT layer taken along a line VII-VII in FIG. 5.
Figure 8:
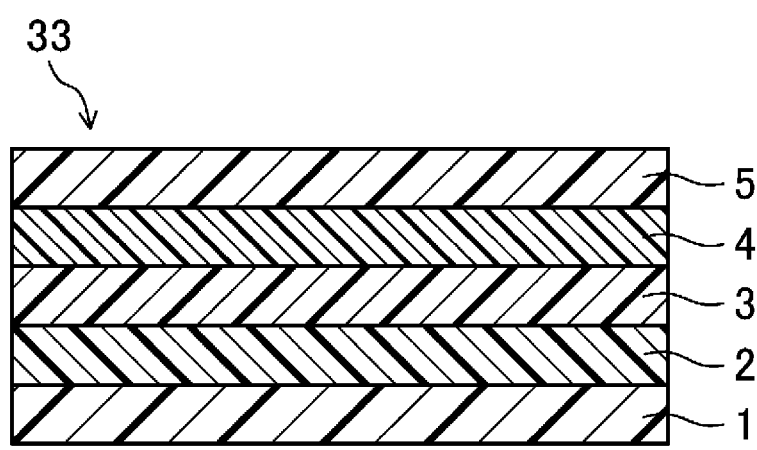
FIG. 8 is a cross-sectional view illustrating an organic EL layer included in the organic EL display device according to the first embodiment of the disclosure.

FIG. 1 to FIG. 21 illustrate a first embodiment of a display device and a method for manufacturing the same according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50 according to the present embodiment. FIG. 2 is a plan view illustrating a schematic configuration of a display region D of the organic EL display device 50. FIG. 3 is a cross-sectional view illustrating, in detail, a configuration of the display region D in the organic EL display device 50. FIG. 4 is an equivalent circuit diagram illustrating a pixel circuit 45 in the organic EL display device 50. FIG. 5 is a plan view of a TFT layer 30a included in the organic EL display device 50. FIG. 6 and FIG. 7 are cross-sectional views of the TFT layer 30a taken along a line VI-VI and a line VII-VII in FIG. 5, respectively. FIG. 8 is a cross-sectional view illustrating an organic EL layer 33 included in the organic EL display device 50.

As illustrated in FIG. 1, the organic EL display device 50 includes, for example, the display region D having a rectangular shape and configured to display an image, and the frame region F provided around the display region D. Note that in the present embodiment, the display region D having the rectangular shape is exemplified, but the rectangular shape includes a substantial rectangular shape such as a shape whose sides are arc-shaped, a shape whose corners are arc-shaped, and a shape in which a part of a side has a notch.

As illustrated in FIG. 2, a plurality of subpixels P are arranged in a matrix shape in the display region D. In addition, in the display region D, for example, a subpixel P including a red light-emitting region Er configured to display a red color, a subpixel P including a green light-emitting region Eg configured to display a green color, and a subpixel P including a blue light-emitting region Eb configured to display a blue color are provided adjacent to one another, as illustrated in FIG. 2. Note that one pixel is configured by, for example, the three adjacent subpixels P including the red light-emitting region Er, the green light-emitting region Eg, and the blue light-emitting region Eb in the display region D.

A terminal portion T is provided at the middle right end portion of the frame region F in FIG. 1. Further, as illustrated in FIG. 1, in the frame region F, a bending portion B that is bendable at 180° (in a U-shape) with the vertical direction in the drawing as an axis of bending, is provided between the display region D and the terminal portion T to extend in one direction (the vertical direction in the drawing).

As illustrated in FIG. 3, the organic EL display device 50 includes a resin substrate layer 10 provided as a resin substrate, a thin film transistor (hereinafter also referred to as TFT) layer 30a provided on the resin substrate layer 10, and an organic EL element layer 40 provided as a light-emitting element layer on the TFT layer 30a.

The resin substrate layer 10 is formed, for example, of a polyimide resin or the like.

As illustrated in FIG. 3, the TFT layer 30a includes a base coat film 11 provided on the resin substrate layer 10, a first initialization TFT 9*a*, a threshold voltage compensation TFT 9*b*, a write control TFT 9*c*, a drive TFT 9*d*, a power source supply TFT 9*e*, a light emission control TFT 9*f*, a second initialization TFT 9*g*, and a capacitor 9*h* provided as a pixel circuit 45 (see FIG. 4) for each subpixel P on the base coat film 11, and a flattening film 21 provided on each of the TFTs 9*a* to 9*g* and the capacitor 9*h*. Here, in the TFT layer 30*a*, a plurality of the pixel circuits 45 are arranged in a matrix corresponding to the plurality of subpixels P. Note that in the present embodiment, the pixel circuit 45 having the configuration illustrated in FIG. 4 is exemplified, but the disclosure is not limited to the configuration of the pixel circuit 45. In the TFT layer 30*a*, as illustrated in FIG. 2, a plurality of gate lines 16*g* are provided as gate layers to extend parallel to each other in the horizontal direction in the drawing. In the TFT layer 30*a*, as illustrated in FIG. 2, a plurality of light emission control lines 16*e* are provided as gate layers to extend parallel to each other in the horizontal direction in the drawing. In the TFT layer 30*a*, as illustrated in FIG. 2, a plurality of initialization power source lines 18*i* are provided as intermediate metal layers to extend parallel to each other in the horizontal direction in the drawing. Note that, as illustrated in FIG. 2, each of the light emission control lines 16*e* is provided adjacent in a plan view to each of the gate lines 16*g* and each of the initialization power source lines 18*i*. In the TFT layer 30*a*, as illustrated in FIG. 2, a plurality of source lines 20*f* are provided as source layers to extend parallel to each other in the vertical direction in the drawing. In the TFT layer 30*a*, as illustrated in FIG. 2, a plurality of power source lines 20*g* are provided as source layers to extend parallel to each other in the vertical direction in the drawing. Note that, as illustrated in FIG. 2, each of the power source lines 20*g* is provided adjacent in a plan view to each of the source lines 20*f*.

Here, the first initialization TFT 9*a* to the second initialization TFT 9*g* each include a first terminal (see circled number 1 in FIG. 4) and a second terminal (see circled number 2 in FIG. 4) arranged to be spaced apart from each other, and a control terminal for controlling the conduction between the first terminal and the second terminal. Note that the definitions of the first terminal and the second terminal are as illustrated in FIG. 4, and are common to all of the TFT 9*a* to TFT 9*g*.

As illustrated in FIG. 4, in each subpixel P, the control terminal of the first initialization TFT 9*a* is electrically connected to the corresponding gate line 16*g*, the first terminal of the first initialization TFT 9*a* is electrically connected to a gate electrode 16*a* of the capacitor 9*h* described later, and the second terminal of the first initialization TFT 9*a* is electrically connected to the corresponding initialization power source line 18*i*. Here, the first initialization TFT 9*a* is configured to initialize the voltage applied to the control terminal of the drive TFT 9*d* by applying the voltage of the initialization power source line 18*i* to the capacitor 9*h*. Note that the control terminal of the first initialization TFT 9*a* is electrically connected to the gate line 16*g* that is scanned one before the gate line 16*g* that is electrically connected to each of the control terminals of the threshold voltage compensation TFT 9*b*, the write control TFT 9*c*, and the second initialization TFT 9*g*.

As illustrated in FIG. 4, in each subpixel P, a control terminal of the threshold voltage compensation TFT 9*b* is electrically connected to the corresponding gate line 16*g*, the first terminal of the threshold voltage compensation TFT 9*b* is electrically connected to the second terminal of the drive TFT 9*d*, and the second terminal of the threshold voltage compensation TFT 9*b* is electrically connected to the control terminal of the drive TFT 9*d*. Here, the threshold voltage compensation TFT 9*b* is configured to cause the drive TFT 9*d* to be in a diode-connected state in response to selection of the gate line 16*g* to compensate for the threshold voltage of the drive TFT 9*d*.

As illustrated in FIG. 4, in each subpixel P, the control terminal of the write control TFT 9*c* is electrically connected to the corresponding gate line 16*g*, the first terminal of the write control TFT 9*c* is electrically connected to the corresponding source line 20*f*, and the second terminal of the write control TFT 9*c* is electrically connected to the first terminal of the drive TFT 9*d*. Here, the write control TFT 9*c* is configured to apply a voltage of the source line 20*f* to a first terminal of the drive TFT 9*d* in response to a selection of the gate line 16*g*.

As illustrated in FIG. 4, in each subpixel P, the control terminal of the drive TFT 9*d* is electrically connected to the first terminal of the first initialization TFT 9*a* and the second terminal of the threshold voltage compensation TFT 9*b*, the first terminal of the drive TFT 9*d* is electrically connected to each of second terminals of the write control TFT 9*c* and the power source supply TFT 9*e*, and the second terminal of the drive TFT 9*d* is electrically connected to each of the first terminals of the threshold voltage compensation TFT 9*b* and the light emission control TFT 9*f*. Here, the drive TFT 9*d* is configured to apply a drive current corresponding to a voltage applied between the control terminal and the first terminal of the drive TFT 9*d* to the first terminal of the light emission control TFT 9*f* to control the amount of current in the organic EL element 35.

Specifically, as illustrated in FIG. 3 and FIG. 6, the drive TFT 9*d* includes a semiconductor layer 12*ad*, a gate insulating film 13, a gate electrode (control terminal) 16*a*, a first interlayer insulating film 17, a second interlayer insulating film 19, as well as a first terminal 20*a* and a second terminal 20*b*, which are sequentially provided on the base coat film 11. Here, as illustrated in FIG. 5 and FIG. 6, the semiconductor layer 12*ad* is provided in substantially an H-shape on the base coat film 11. As illustrated in FIG. 5 and FIG. 6, the semiconductor layer 12*ad* includes an intrinsic region 12*ac* provided to overlap with the gate electrode 16*a* in a plan view, and a pair of conductor regions 12*aa* and 12*ab* (dot portions in FIG. 5) provided with the intrinsic region 12*ac* interposed therebetween. Note that, as illustrated in FIG. 5, the intrinsic region 12*ac* is provided with an intermediate portion thereof in a substantially V-shape in a plan view. As illustrated in FIG. 3, FIG. 6, and FIG. 7, the gate insulating film 13 is provided to cover the semiconductor layer 12*ad*. Note that, as illustrated in FIG. 6, a step S having two steps along the circumferential end of the gate electrode 16*a* formed by a first etching step and a second etching step described later resides on the surface of the gate insulating film 13 exposed from the gate electrode 16*a*. As illustrated in FIG. 3, FIG. 5, and FIG. 6, the gate electrode 16*a* is provided in a rectangle island shape in a plan view on the gate insulating film 13 to overlap with the intrinsic region 12*ac* of the semiconductor layer 12*ad*. As illustrated in FIG. 5 and FIG. 6, the gate electrode 16*a* includes a first metal layer 14*a* provided on the gate insulating film 13, and a second metal layer 15*a* provided on the first metal layer 14*a*. Note that as illustrated in FIG. 5 to FIG. 7, in a direction L (the horizontal direction in FIG. 5) of the channel length of the intrinsic region 12*ac* of the semiconductor layer 12*ad* and in a direction orthogonal to the direction L (the vertical direction in FIG. 5), the length of the second metal layer 15*a* is equal to or less than the length of the first metal layer 14*a*. The first metal layer 14*a* and the second metal layer 15*a* are formed of the same refractory metal, for example, tungsten, tantalum, molybdenum, niobium, titanium, molybdenum nitride, or the like. As illustrated in FIG. 6, the intrinsic region 12ac of the semiconductor layer 12ad is provided to align with the first metal layer 14a. In the present specification, "align with" includes not only a case where the side surfaces of the two layers of interest are flush in the vertical direction, but also a case where the side surfaces of the two layers form continuous inclined face such as a tapered shape, and is not limited to strict coincidence of the side surfaces, so that a deviation of the side surfaces of approximately 2 μm to 3 μm due to a difference in etching rate and the like is included. As illustrated in FIG. 3, FIG. 6, and FIG. 7, the first interlayer insulating film 17 is provided to cover the gate electrode 16a, the light emission control line 16e, and the gate line 16g. As illustrated in FIG. 3, FIG. 6, and FIG. 7, the second interlayer insulating film 19 is provided on the first interlayer insulating film 17 via the capacitance electrode 18c described later. As illustrated in FIG. 3, the first terminal 20a and the second terminal 20b are provided on the second interlayer insulating film 19 to be spaced apart from each other. As illustrated in FIG. 3, the first terminal 20a and the second terminal 20b are electrically connected to the conductor region 12aa and the conductor region 12ab of the semiconductor layer 12ad, respectively, via respective contact holes formed in a layered film of the gate insulating film 13, the first interlayer insulating film 17, and the second interlayer insulating film 19. Note that, as illustrated in FIG. 7, the gate line 16g in which the first metal layer 14g and the second metal layer 15g are layered, and the light emission control line 16e in which the first metal layer 14e and the second metal layer 15e are layered have a layered structure similar to the layered structure of the gate electrode 16a described above.

As illustrated in FIG. 4, in each subpixel P, the control terminal of the power source supply TFT 9e is electrically connected to the corresponding light emission control line 16e, the first terminal of the power source supply TFT 9e is electrically connected to the corresponding power source line 20g, and the second terminal of the power source supply TFT 9e is electrically connected to the first terminal of the drive TFT 9d. Here, the power source supply TFT 9e is configured to apply a voltage of the power source line 20g to the first terminal of the drive TFT 9d in response to selection of the light emission control line 16e.

As illustrated in FIG. 4, in each subpixel P, the control terminal of the light emission control TFT 9f is electrically connected to the corresponding light emission control line 16e, the first terminal of the light emission control TFT 9f is electrically connected to the second terminal of the drive TFT 9d, and the second terminal of the light emission control TFT 9f is electrically connected to the first electrodes 31 of the organic EL element 35 described later. Here, the light emission control TFT 9f is configured to apply the drive current to the organic EL element 35 in response to the selection of the light emission control line 16e.

Specifically, as illustrated in FIG. 3, the light emission control TFT 9f includes a semiconductor layer 12ae, the gate insulating film 13, a gate electrode (control terminal) 16b, a first interlayer insulating film 17, and a second interlayer insulating film 19, as well as a first terminal 20c and a second terminal 20d, which are sequentially provided on the base coat film 11. Here, similar to the semiconductor layer 12ad described above, the semiconductor layer 12ae is provided in an island shape on the base coat film 11, and includes an intrinsic region and a pair of conductor regions provided with the intrinsic region interposed therebetween.

As illustrated in FIG. 3, the gate insulating film 13 is provided to cover the semiconductor layer 12ae. As illustrated in FIG. 3, the gate electrode 16b is provided on the gate insulating film 13 to overlap with the intrinsic region of the semiconductor layer 12ae. As illustrated in FIG. 3, the first interlayer insulating film 17 and the second interlayer insulating film 19 are sequentially provided to cover the gate electrode 16b. As illustrated in FIG. 3, the first terminal 20c and the second terminal 20d are provided on the second interlayer insulating film 19 to be spaced apart from each other. As illustrated in FIG. 3, the first terminal 20c and the second terminal 20d are electrically connected to the pair of respective conductor regions of the semiconductor layer 12ae, via respective contact holes formed in a layered film of the gate insulating film 13, the first interlayer insulating film 17, and the second interlayer insulating film 19. Note that the first initialization TFT 9a, the threshold voltage compensation TFT 9b, the write control TFT 9c, the power source supply TFT 9e, and the second initialization TFT 9g have substantially the same configuration as that of the light emission control TFT 9f described above.

As illustrated in FIG. 4, in each subpixel P, the control terminal of the second initialization TFT 9g is electrically connected to the corresponding gate line 16g, the first terminal of the second initialization TFT 9g is electrically connected to the organic EL element 35, and the second terminal of the second initialization TFT 9g is electrically connected to the corresponding initialization power source line 18i. Here, the second initialization TFT 9g is configured to reset a charge accumulated in a first electrode 31 of the organic EL element 35 in response to the selection of the gate line 16g.

As illustrated in FIG. 5 and FIG. 7, the capacitor 9h includes the gate electrode 16a provided as a lower electrode, the first interlayer insulating film 17 provided as a first inorganic insulating film on the gate electrode 16a, and the capacitance electrode 18c provided as an upper electrode and an intermediate metal layer to overlap with the gate electrode 16a in a plan view on the first interlayer insulating film 17. As illustrated in FIG. 4, in each subpixel P, the gate electrode 14a of the capacitor 9h is electrically connected to the gate electrode 14a of the drive TFT 9d by being integrally formed with the gate electrode 14a of the drive TFT 9d, and is electrically connected to the first terminal of the first initialization TFT 9a and the second terminal of the threshold voltage compensation TFT 9b, and the capacitance electrode 18c of the capacitor 9h is electrically connected to the corresponding power source line 20g. Here, the capacitor 9h is configured to be charged with the voltage of the corresponding source line 20f in a case where the corresponding gate line 16g is in the selected state and maintain the charged voltage, to thereby maintain the voltage applied to the gate electrode 16a of the drive TFT 9d in a case where the corresponding gate line 16g is in the unselected state. As illustrated in FIG. 5, the capacitance electrode 18c is provided over the entire circumference of the circumferential end of the gate electrode 16a up to the outside of the circumferential end of the gate electrode 16a. As illustrated in FIG. 5 and FIG. 7, the capacitance electrode 18c is provided with an opening 18 m for exposing the first interlayer insulating film 17. As illustrated in FIG. 6 and FIG. 7, the second interlayer insulating film 19 is provided as a second inorganic insulating film on the capacitance electrode 18c to cover the capacitance electrode 18c. Furthermore, a connection wiring line 20e electrically connected to the gate electrode 16a via a contact hole formed in the first interlayer insulating film 17 and the second interlayer insulating film 19 exposed from the opening 18m of the capacitance electrode 18c is provided on the second interlayer insulating film 19.

Here, in each subpixel P, the gate line 16g and the gate electrode (lower electrode) 16a (lower side portion thereof in the drawing) are provided to be arranged side by side with each other, as illustrated in FIG. 5. As illustrated in FIG. 7, a distance Wa between the first metal layer 14g of the gate line 16g and the first metal layer 14a of the gate electrode (lower electrode) 16a aligned with each other is shorter than a distance Wb between the second metal layer 15g of the gate line 16g and the second metal layer 15a of the gate electrode (lower electrode) 16a aligned with each other. Furthermore, as illustrated in FIG. 5 and FIG. 7, an end portion of the capacitance electrode (upper electrode) 18c on the gate line 16g side is arranged in a plan view between the first metal layer 14g of the gate line 16g and the first metal layer 14a of the gate electrode (lower electrode) 16a aligned with each other.

In each subpixel, the light emission control line 16e and the gate electrode (lower electrode) 16a (upper side portion thereof in the drawing) are provided to be aligned with each other, as illustrated in FIG. 5. As illustrated in FIG. 7, a distance We between the first metal layer 14e of the light emission control line 16e and the first metal layer 14a of the gate electrode (lower electrode) 16a aligned with each other is shorter than the distance Wb between the second metal layer 15e of the light emission control line 16e and the second metal layer 15a of the gate electrode (lower electrode) 16a aligned with each other. Furthermore, as illustrated in FIG. 5 and FIG. 7, an end portion of the capacitance electrode (upper electrode) 18c on the light emission control line 16e side is arranged in a plan view between the first metal layer 14e of the light emission control line 16e and the first metal layer 14a of the gate electrode (lower electrode) 16a aligned with each other.

As illustrated in FIG. 3, the organic EL element layer 40 includes a plurality of organic EL elements 35 provided as a plurality of light-emitting elements arranged in a matrix on the flattening film 21 corresponding to the plurality of pixel circuits 45, and a sealing film 39 provided to cover each of the plurality of organic EL elements 35.

As illustrated in FIG. 3, the organic EL element 35 includes the first electrode 31 provided on the flattening film 21, an organic EL layer 33 provided on the first electrode 31, and a second electrode 34 provided on the organic EL layer 33 to be common to the entire display region D.

As illustrated in FIG. 3, the first electrode 31 is electrically connected to the second terminal 20d of the light emission control TFT 9f of each of the subpixels P via a contact hole formed in the flattening film 21. Further, the first electrode 31 functions to inject holes (positive holes) into the organic EL layer 33. Further, the first electrode 31 is preferably formed of a material having a large work function to improve the efficiency of hole injection into the organic EL layer 33. Here, examples of materials constituting the first electrode 31 include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, examples of the materials constituting the first electrode 31 may include alloy such as astatine (At)/astatine oxide (AtO$_2$). Furthermore, examples of the materials constituting the first electrode 31 may include electrically conductive oxide such as tin oxide (SnO), zinc oxide (ZnO), indium tin oxide (ITO), and indium zinc oxide (IZO). Additionally, the first electrode 31 may be formed by layering a plurality of layers formed of any of the materials described above. Note that, examples of compound materials having a large work function include indium tin oxide (ITO) and indium zinc oxide (IZO).

The circumferential end portion of the first electrode 31 is covered with an edge cover 32 provided in a lattice pattern in the entire display region D. Here, examples of a material constituting the edge cover 32 include positive-working photosensitive resin such as polyimide resin, acrylic resin, polysiloxane resin, and novolak resin.

As illustrated in FIG. 8, the organic EL layer 33 includes a hole injection layer 1, a hole transport layer 2, a light-emitting layer 3, an electron transport layer 4, and an electron injection layer 5, which are sequentially provided on the first electrode 31.

The hole injection layer 1 is also referred to as an anode buffer layer, and functions to reduce an energy level difference between the first electrode 31 and the organic EL layer 33 to thereby improve the efficiency of hole injection into the organic EL layer 33 from the first electrode 31. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives and the like.

The hole transport layer 2 functions to improve the efficiency of hole transport from the first electrode 31 to the organic EL layer 33. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide and the like.

The light-emitting layer 3 is a region where holes and electrons are injected from the first electrode 31 and the second electrode 34, respectively, and the holes and the electrons recombine, in a case where a voltage is applied via the first electrode 31 and the second electrode 34. Here, the light-emitting layer 3 is formed of a material having high light-emitting efficiency. Moreover, examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane and the like.

The electron transport layer 4 functions to facilitate migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds and the like, as organic compounds.

The electron injection layer 5 functions to reduce an energy level difference between the second electrode 34 and the organic EL layer 33 to thereby improve the efficiency of electron injection into the organic EL layer 33 from the second electrode 34, and this function allows the drive voltage of the organic EL element 35 to be reduced. Note that the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO) and the like.

As illustrated in FIG. 3, the second electrode 34 is provided to cover the organic EL layer 33 of each of the subpixels P and the edge cover 32 common to all the subpixels P. Further, the second electrode 34 functions to inject electrons into the organic EL layer 33. Further, the second electrode 34 is preferably formed of a material having a small work function to improve the efficiency of electron injection into the organic EL layer 33.

Here, examples of materials constituting the second electrode 34 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further, the second electrode 34 may be formed of alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Further, the second electrode 34 may be formed of an electrically conductive oxide such as tin oxide (SnO), zinc oxide (ZnO), indium tin oxide (ITO), and indium zinc oxide (IZO). Further, the second electrode 34 may be formed by layering a plurality of layers formed of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al) and the like.

As illustrated in FIG. 3, the sealing film 39 includes a first sealing inorganic insulating film 36 provided to cover the second electrode 34, a sealing organic film 37 provided on the first sealing inorganic insulating film 36, and a second sealing inorganic insulating film 38 provided to cover the sealing organic film 37, and has a function to protect the organic EL layer 33 from moisture, oxygen, and the like. Here, the first sealing inorganic insulating film 36 and the second sealing inorganic insulating film 38 are each formed of, for example, an inorganic material such as silicon oxide ($SiO_2$), aluminum oxide ($Al_2O_3$), silicon nitride ($SiN_x$ (x is a positive number)) such as trisilicon tetranitride ($Si_3N_4$), or silicon carbonitride (SiCN). Further, the sealing organic film 37 is formed of, for example, an organic material such as acrylic resin, polyurea resin, parylene resin, polyimide resin, and polyamide resin.

In the organic EL display device 50 having the configuration described above, in each subpixel P, the organic EL element 35 is brought into a non-light-emitting state in a case where the corresponding light emission control line 16e is selected to be in a non-activated state. In the non-light-emitting state, the corresponding gate line 16g (which is electrically connected to the first initialization TFT 9a) is selected, and a gate signal is input to the first initialization TFT 9a via the gate line 16g, so that the first initialization TFT 9a is brought into an on state, a voltage of the corresponding initialization power source line 18i is applied to the capacitor 9h, and the drive TFT 9d is brought into the on state. Thereby, the charge of the capacitor 9h is discharged to initialize the voltage applied to the control terminal (gate electrode) 16a of the drive TFT 9d. Next, the corresponding gate line 16g (which is electrically connected to the threshold voltage compensation TFT 9b, the write control TFT 9c, and the second initialization TFT 9g) is selected and activated, so that the threshold voltage compensation TFT 9b and the write control TFT 9c are brought into the on state. A predetermined voltage corresponding to a source signal transmitted via the corresponding source line 20f is written to the capacitor 9h via the drive TFT 9d in a diode-connected state and the second initialization TFT 9g is brought into the on state, so that an initialization signal is applied to the first electrode 31 of the organic EL element 35 via the corresponding initialization power source line 18i to reset the charge accumulated in the first electrode 31. Thereafter, the corresponding light emission control line 16e is selected, and the power source supply TFT 9e and the light emission control TFT 9f are brought into the on state, so that a drive current corresponding to the voltage applied to the control terminal (gate electrode) 16a of the drive TFT 9d is supplied to the organic EL element 35 from the corresponding power source line 20g. In this way, in the organic EL display device 50, in each subpixel P, the organic EL element 35 emits light at a luminance corresponding to the drive current, and the image display is performed.

Figure 9:
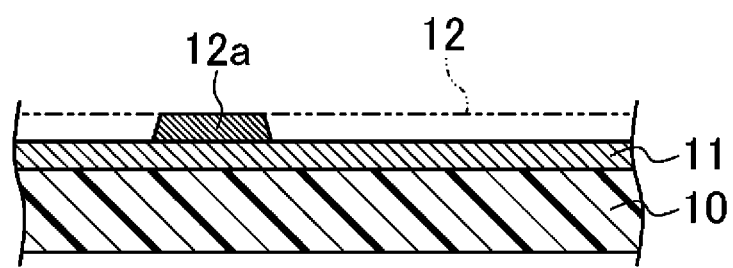
FIG. 9 is a cross-sectional view illustrating a semiconductor layer forming step in a method for manufacturing the organic EL display device according to the first embodiment of the disclosure, where

Next, a method for manufacturing the organic EL display device 50 according to the present embodiment will be described. Note that the method for manufacturing the organic EL display device 50 according to the present embodiment includes a TFT layer forming step in which a semiconductor layer forming step, a gate insulating film forming step, a first metal film deposition step, a first photo step, a first etching step a first peeling step, a second metal film deposition step, a second photo step, a second etching step, a second peeling step, and a conductor forming step are sequentially performed, and an organic EL element layer forming step. Here, FIG. 9 is a cross-sectional view illustrating the semiconductor layer forming step in the method for manufacturing the organic EL display device 50, where FIG. 9 is a view corresponding to FIG. 7. FIG. 10, FIG. 11, FIG. 12, FIG. 13, FIG. 14, FIG. 15, and FIG. 16 are cross-sectional views illustrating the first metal film deposition step, the first photo step, the first etching step, the second metal film deposition step, the second photo step, the second etching step, and the conductor forming step in the method for manufacturing the organic EL display device 50, respectively, and are views corresponding to FIG. 6.

TFT Layer Forming Step

First, for example, an inorganic insulating film (a thickness of approximately 1000 nm) formed of silicon oxide or the like is formed on the resin substrate layer 10 formed on a glass substrate, for example, by a plasma Chemical Vapor Deposition (CVD) method to form the base coat film 11.

Next, for example, an amorphous silicon film (a thickness of approximately 50 nm) is formed on the entire substrate on which the base coat film 11 is formed, by the plasma CVD method, the amorphous silicon film is crystallized by laser annealing or the like to form a polysilicon film 12 (see the dot-dash line in FIG. 9), and subsequently the polysilicon film 12 is patterned to form the semiconductor layer 12a or the like as illustrated in FIG. 9 (semiconductor layer forming step).

Thereafter, an inorganic insulating film (approximately 100 nm) formed of a silicon oxide film or the like is formed on the entire substrate on which the semiconductor layer 12a and the like are formed by, for example, the plasma CVD method, to form the gate insulating film 13 to cover the semiconductor layer 12a (gate insulating film forming step).

Figure 10:
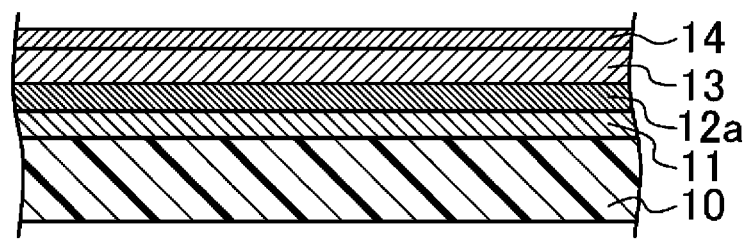
FIG. 10 is a cross-sectional view illustrating a first metal film deposition step in the method for manufacturing the organic EL display device according to the first embodiment of the disclosure, where

Furthermore, a molybdenum film (a thickness of approximately 125 nm) is formed on the entire substrate on which the gate insulating film 13 is formed by, for example, a sputtering method, and the first metal film 14 is formed to cover the gate insulating film 13 as illustrated in FIG. 10 (first metal film deposition step).

Figure 11:
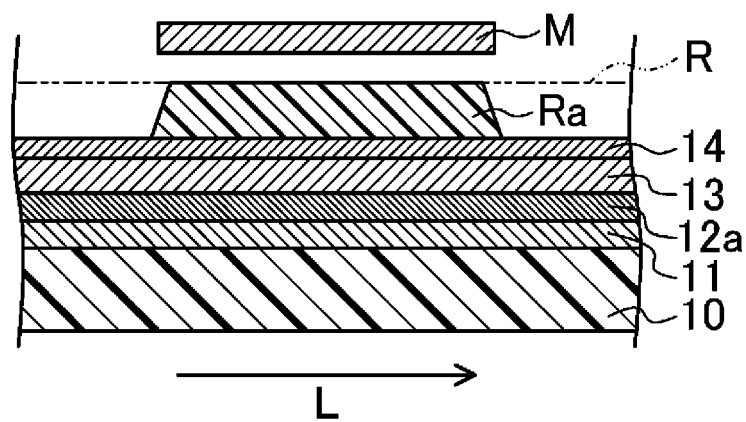
FIG. 11 is a cross-sectional view illustrating a first photo step in the method for manufacturing the organic EL display device according to the first embodiment of the disclosure, where

Next, the resist R is applied on the first metal film 14, and subsequently, the resist R (dot-dash line in FIG. 11) is exposed using the first mask M to form a first resist pattern Ra, as illustrated in FIG. 11 (first photo step).

Figure 12:
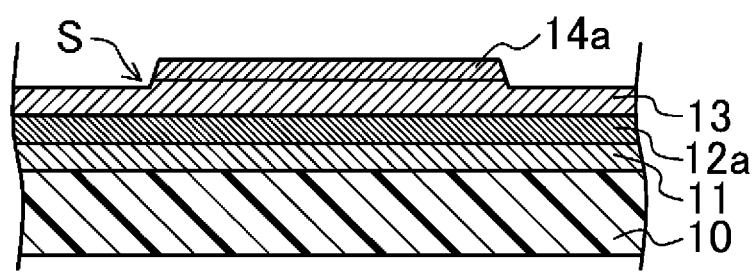
FIG. 12 is a cross-sectional view illustrating a first etching step in the method for manufacturing the organic EL display device according to the first embodiment of the disclosure, where

Then, the first metal film 14 exposed from the first resist pattern Ra is etched to form the first metal layers 14a, 14e, 14g, and the like as illustrated in FIG. 12 (first etching step). Here, in the first etching step, since the surface layer of the gate insulating film 13 underlying the first metal film 14 is also etched, a step having one step is formed on the surface of the gate insulating film 13 as illustrated in FIG. 12.

Thereafter, the first resist pattern Ra used in the first etching step is peeled (first peeling step).

Figure 13:
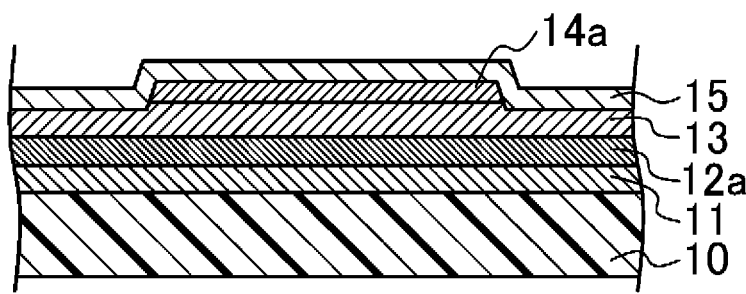
FIG. 13 is a cross-sectional view illustrating a second metal film deposition step in the method for manufacturing the organic EL display device according to the first embodiment of the disclosure, where

Furthermore, a molybdenum film (a thickness of approximately 125 nm) is formed by, for example, a sputtering method to peel the first resist pattern Ra to cover the exposed first metal layers 14a, 14c, 14g, and the like and the second metal film 15 is formed as illustrated in FIG. 13 (second metal film deposition step).

Figure 14:
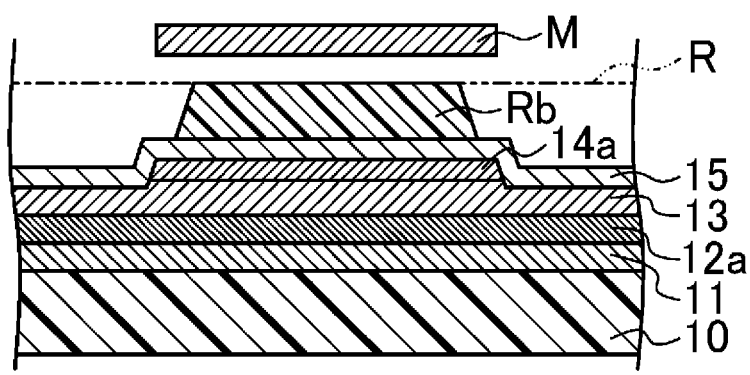
FIG. 14 is a cross-sectional view illustrating a second photo step in the method for manufacturing the organic EL display device according to the first embodiment of the disclosure, where

Next, the resist R is applied on the second metal film 15, and subsequently, the resist R is exposed using a second mask M to form a second resist pattern Rb, as illustrated in FIG. 14 (second photo step). Here, by making the amount of exposure in the second photo step greater than the amount of exposure in the first photo step, as the second mask M, a mask common to the first mask M can be used.

Figure 15:
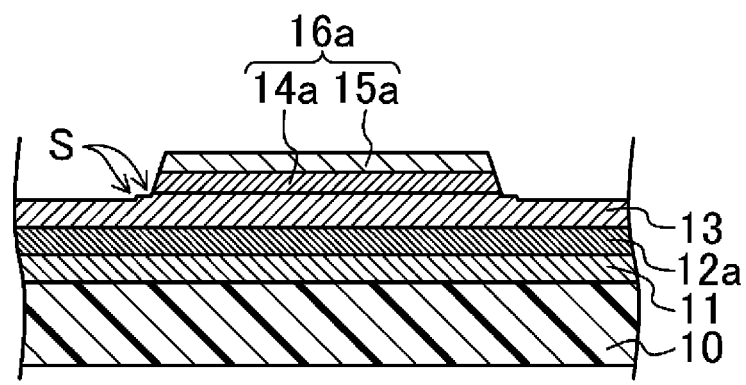
FIG. 15 is a cross-sectional view illustrating a second etching step in the method for manufacturing the organic EL display device according to the first embodiment of the disclosure, where

Furthermore, the second metal film 15 exposed from the second resist pattern Rb is etched to form the second metal layers 15a, 15e, 15g, and the like to form the gate layer including the gate electrode 16a, the light emission control line 16e, and the gate line 16g in which the first metal layer 14a, 14e, and 14g are layered, respectively, as well as the second metal layers 15a, 15e, and 15g, are layered, respectively, as illustrated in FIG. 15 (second etching step). Here, in the second etching step, since the surface layer of the gate insulating film 13 underlying the second metal film 14 is also etched again, a step S having two steps is formed on the surface of the gate insulating film 13 as illustrated in FIG. 15. Note that it is understood according to the step S having two steps formed on the surface of the gate insulating film 13 that the gate layer including the gate electrode 16a, the light emission control line 16e, and the gate line 16g is formed by repeating the film formation and patterning of the metal film twice.

Thereafter, the second resist pattern Rb used in the second etching step is peeled (second peeling step).

Figure 16:
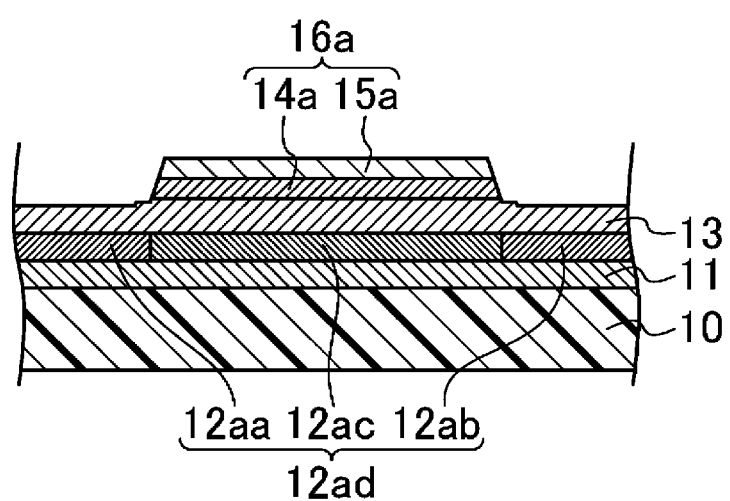
FIG. 16 is a cross-sectional view illustrating a conductor forming step in the method for manufacturing the organic EL display device according to the first embodiment of the disclosure, where

Subsequently, by doping impurity ions into the semiconductor layer 12a and the like by using the gate electrode 16a, the light emission control line 16e, and the gate line 16g as masks, a portion of the semiconductor layer 12a and the like is made into electrically conductive to form the semiconductor layers 12ad, 12ae, and the like including the conductor region 12aa, the conductor region 12ab, and the intrinsic region 12ac, as illustrated in FIG. 16 (conductor forming step). Note that in the present embodiment, the method for manufacturing in which the conductor forming step is performed after the second peeling step is exemplified, but the conductor forming step may be performed before the second peeling step.

Thereafter, an inorganic insulating film (a thickness of approximately 100 nm) formed of a silicon oxide film or the like is formed on the entire substrate on which the semiconductor layers 12ad, 12ae and the like are formed by, for example, the plasma CVD method to form the first interlayer insulating film 17.

Next, a metal film such as a molybdenum film (a thickness of approximately 250 nm) is formed, for example, by a sputtering method on the entire substrate on which the first interlayer insulating film 17 is formed, and subsequently the metal film is patterned to form an intermediate metal layer such as the capacitance electrode 18c and the initialization power source line 18i. Note that the intermediate metal layer may be used together with the gate layer as, for example, a lead wiring line for wiring from a terminal of the terminal portion T to the data signal line of the display region D. In this case, in order to have matched wiring line resistance of the lead wiring line, the gate layer and the intermediate metal layer are formed of the same metal material and have the same film thickness preferably. Thus, it is preferable that the intermediate metal layer be a metal layered film of the first metal layer and the second metal layer by a similar step to that of the gate layer.

Furthermore, an inorganic insulating film (a thickness of approximately 500 nm) formed of a silicon oxide film or the like is formed on the entire substrate on which the capacitance electrode 18c is formed by, for example, the plasma CVD method to form the second interlayer insulating film 19, and subsequently the layered film of the gate insulating film 13, the first interlayer insulating film 17, and the second interlayer insulating film 19 is patterned to form a contact hall.

Thereafter, a titanium film (a thickness of approximately 30 nm), an aluminum film (a thickness of approximately 300 nm), a titanium film (a thickness of approximately 50 nm), and the like are sequentially formed by, for example, a sputtering method on the entire substrate on which the contact hall is formed, to form the source metal film, and subsequently the source metal film is patterned to form the connection wiring line 20e, the source line 20f, the power source line 20g, and the like.

Finally, a polyimide-based photosensitive resin film (a thickness of approximately 2 μm) is applied by, for example, a spin coating method or a slit coating method to the entire substrate on which the connection wiring line 20e and the like is formed, and subsequently pre-baking, exposing, developing, and post-baking are performed on the applied film to form the flattening film 21.

As described above, the TFT layer 30a can be formed.

Organic EL Element Layer Forming Step

The first electrode 31, the edge cover 32, the organic EL layer 33 (the hole injection layer 1, the hole transport layer 2, the light-emitting layer 3, the electron transport layer 4, and the electron injection layer 5), and the second electrode 34 are formed on the flattening film 21 of the TFT layer 30a by using a known method, and subsequently the sealing film 39 (the first sealing inorganic insulating film 36, the sealing organic film 37, and the second sealing inorganic insulating film 38) are formed to form the organic EL element layer 40.

Then, a protective sheet (not illustrated) is bonded on the substrate surface on which the sealing film 39 is formed, and subsequently the laser light is irradiated from the glass substrate side of the resin substrate layer 10, so that the glass substrate is peeled off from a lower surface of the resin substrate layer 10, and subsequently, a protective sheet (not illustrated) is bonded on the lower surface of the resin substrate layer 10 from which the glass substrate has been peeled off.

The organic EL display device 50 of the present embodiment can be manufactured in the manner described above.

Note that in the present embodiment, the organic EL display device 50 including the TFT layer 30a and the method for manufacturing the same are exemplified, but may be an organic EL display device including a TFT layer 30b instead of the TFT layer 30a and the method for manufacturing the same. Here, FIG. 17 and FIG. 18 are a cross-sectional view of the TFT layer 30b constituting a modified example of the organic EL display device 50 according to the present embodiment, where FIG. 17 and FIG. 18 are views corresponding to FIG. 6 and FIG. 7.

In the TFT layer 30a of the present embodiment, the semiconductor layer 12ad and the like are formed of low-temperature polysilicon. In the TFT layer 30b of the modified example, however, a semiconductor layer 12bd and the like are formed of an oxide semiconductor. Thus, in the TFT layer 30b, only the cross-sectional shape of the underlying gate insulating film 13b of the semiconductor layer 12bd of each of the TFTs 9a to 9g, and accordingly the cross-sectional shape of the first interlayer insulating film 17b, the capacitance electrode 18cb, and the second interlayer insulating film 19b differ from that of the TFT layer 30a, and other configurations are substantially the same as those of the TFT layer 30a.

Figure 17:
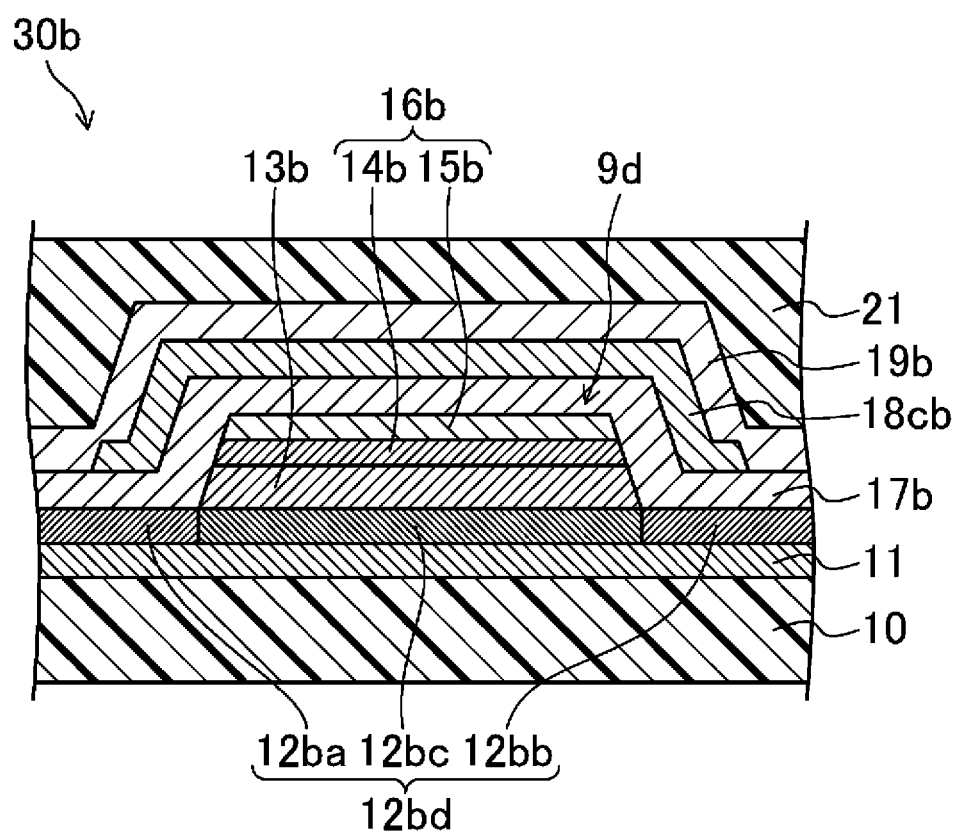
FIG. 17 is a cross-sectional view of the TFT layer constituting a modified example of the organic EL display device according to the first embodiment of the disclosure, where
Figure 18:
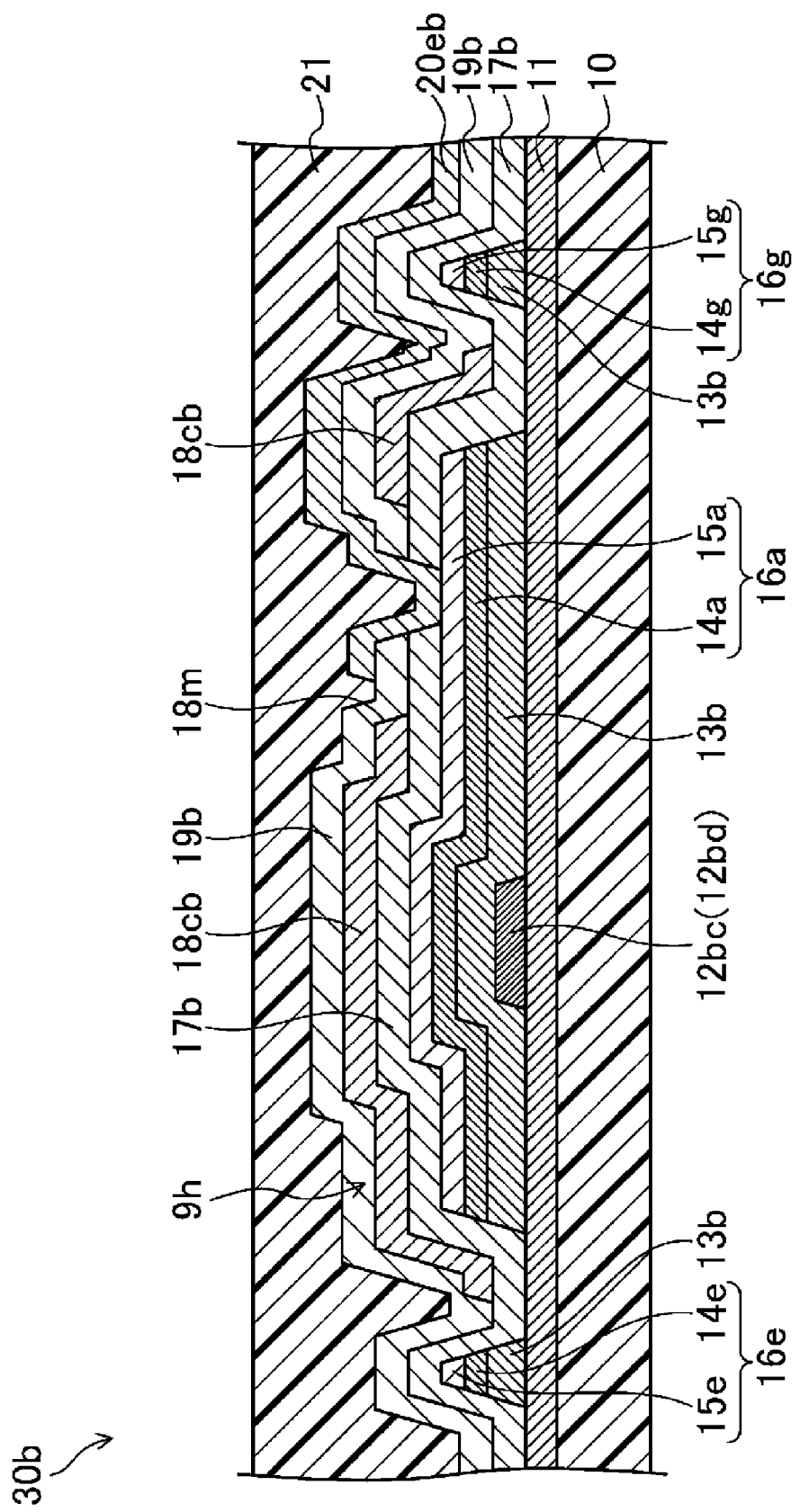
FIG. 18 is a cross-sectional view of a TFT layer constituting a modified example of the organic EL display device according to the first embodiment of the disclosure, where

Describing the drive TFT 9d representatively, as illustrated in FIG. 17, the drive TFT 9d includes a semiconductor layer 12bd, a gate insulating film 13b, a gate electrode 16b, a first interlayer insulating film 17b, and a second interlayer insulating film 19b, as well as a first terminal 20a (see FIG. 3) and a second terminal 20b (see FIG. 3), which are sequentially provided on the base coat film 11. Here, similar to the semiconductor layer 12ad, the semiconductor layer 12bd is provided in a substantially H-shape on the base coat film 11. Similar to the semiconductor layer 12ad, the semiconductor layer 12bd includes an intrinsic region 12bc provided to overlap with the gate electrode 16b in a plan view, and a pair of conductor regions 12ba and 12bb provided with the intrinsic region 12bc interposed therebetween. Note that, similar to the intrinsic region 12ac, the intrinsic region 12bc is provided with an intermediate portion thereof in a substantially V-shape in a plan view. As illustrated in FIG. 17 and FIG. 18, the gate insulating film 13b is provided in an island shape to align with the gate electrode 16b, the light emission control line 16e, and the gate line 16g. As illustrated in FIG. 17, the gate electrode 16b is provided in a rectangle island shape in a plan view on the gate insulating film 13b to overlap with the intrinsic region 12bc of the semiconductor layer 12bd. As illustrated in FIG. 17, the gate electrode 16b includes a first metal layer 14b provided on the gate insulating film 13b, and a second metal layer 15b provided on the first metal layer 14b. Note that the first metal layer 14b and the second metal layer 15b are formed of the same refractory metal, for example, tungsten, tantalum, molybdenum, niobium, titanium, molybdenum nitride or the like. The intrinsic region 12bc of the semiconductor layer 12bd is provided to align with the first metal layer 14b of the gate electrode 16b. As illustrated in FIG. 17 and FIG. 18, the first interlayer insulating film 17b is provided to cover the gate electrode 16b, the light emission control line 16e, and the gate line 16g. As illustrated in FIG. 17 and FIG. 18, the second interlayer insulating film 19b is provided on the first interlayer insulating film 17b via the capacitance electrode 18cb.

The organic EL display device including the TFT layer 30b can be manufactured as will be described below. Here, FIG. 19, FIG. 20, and FIG. 21 are cross-sectional views illustrating a second photo step, a second etching step, and a conductor forming step, respectively, in a method for manufacturing the modified example of the organic EL display device according to the present embodiment, where FIG. 19, FIG. 20, and FIG. 21 are views corresponding to FIG. 17.

Furthermore, in the semiconductor layer forming step of the method for manufacturing the organic EL display device 50 described above, an oxide semiconductor film (a thickness of approximately from 30 nm to 100 nm) formed of, for example, InGaZnO$_4$ or the like is formed by a sputtering method on the entire substrate on which the base coat film 11 is formed, and subsequently, a photolithography process, an etching process, and a resist peeling process are performed on the oxide semiconductor film to form the semiconductor layer 12b (see FIG. 19).

Figure 19:
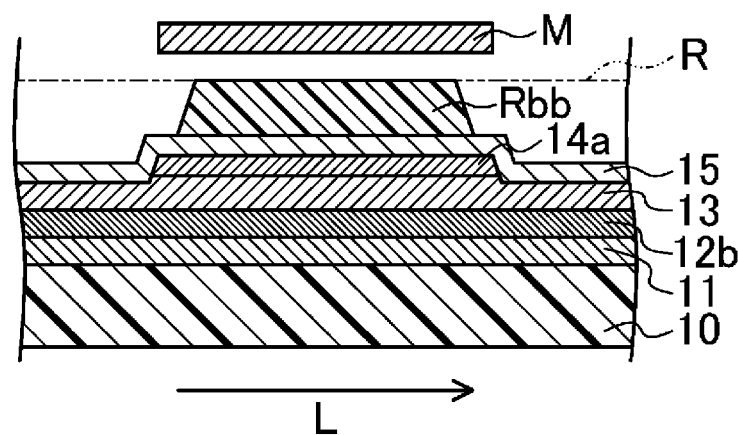
FIG. 19 is a cross-sectional view illustrating a second photo step in a method for manufacturing the modified example of the organic EL display device according to the first embodiment of the disclosure, where

Thereafter, the gate insulating film forming step, the first metal film deposition step, the first photo step, the first etching step, the first peeling step, and the second metal film deposition step of the method for manufacturing the organic EL display device 50 described above are sequentially performed, the resist R is applied on the second metal film 15, and subsequently, the resist R is exposed using the second mask M to form a second resist pattern Rbb as illustrated in FIG. 19 (second photo step).

Figure 20:
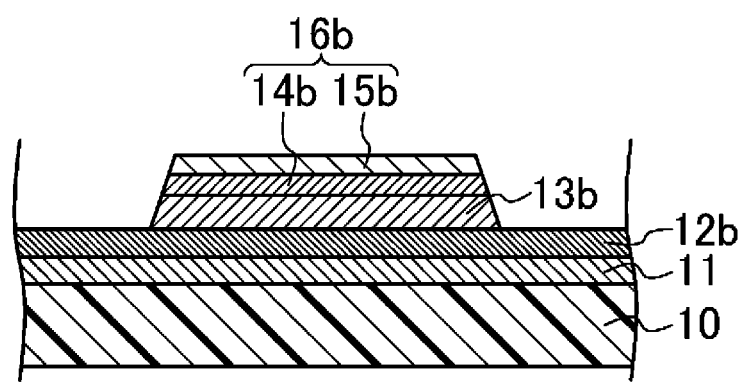
FIG. 20 is a cross-sectional view illustrating a second etching step in the method for manufacturing the modified example of the organic EL display device according to the first embodiment of the disclosure, where
Figure 21:
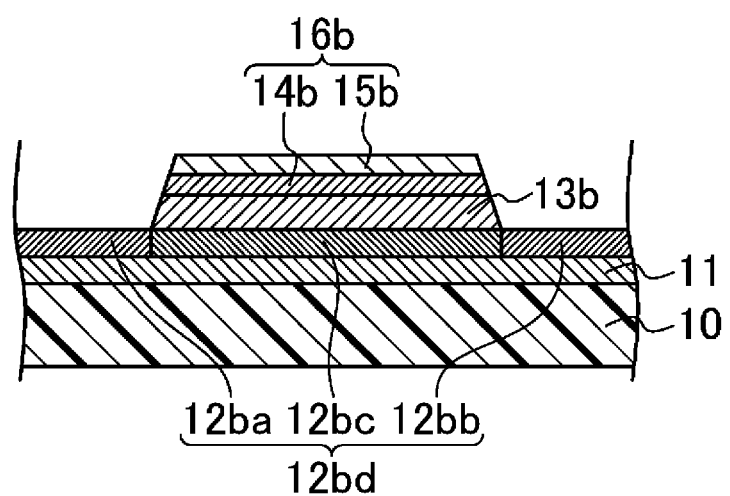
FIG. 21 is a cross-sectional view illustrating a conductor forming step in the method for manufacturing the modified example of the organic EL display device according to the first embodiment of the disclosure, where

Furthermore, the second metal film 15 exposed from the second resist pattern Rbb, the first metal layer 14a and the gate insulating film 13 formed in the first etching step are etched to form the gate layer including the gate electrode 16b and the like in which the first metal layer 14b and the second metal layer 15b are layered, and the gate insulating film 13b as illustrated in FIG. 20 (second etching step).

Thereafter, the second resist pattern Rbb used in the second etching step is peeled (second peeling step).

Subsequently, by performing a plasma treatment such as hydrogen plasma treatment or helium plasma treatment on the semiconductor layer by using the gate electrode 16b and the like as a mask, a portion of the semiconductor layer is made into electrically conductive to form the semiconductor layer 12bd including the conductor region 12ba, the conductor region 12bb, and the intrinsic region 12bc as illustrated in FIG. 21 (conductor forming step). Note that in the present modified example, the method for manufacturing in which the conductor forming step is performed after the second peeling step is exemplified, but the conductor forming step may be performed before the second peeling step.

Thereafter, similar to the method for manufacturing the organic EL display device 50 described above, the first interlayer insulating film 17b, the capacitance electrode 18cb, the initialization power source line 18i, the connection wiring line 20e, the source line 20f, the power source line 20g, and the flattening film 21 or the like are formed to form the TFT layer 30b, and the organic light-emitting element layer forming step described above is performed, so that the organic EL display device including the TFT layer 30b can be manufactured.

As described above, according to the organic EL display device 50 and the method for manufacturing the same of the present embodiment, the first metal layers 14a, 14e, and 14g formed by the first metal film deposition step, the first photo step, and the first etching step, and the second metal layers 15a, 15e and 15g formed by the second metal film deposition step, the second photo step, and the second etching step are layered on the gate insulating film 13 to form the gate layer including the gate electrode 16a, the light emission control line 16e, and the gate line 16g of the TFT layer 30a. Here, since the film thickness of the first metal film 14 formed by the first metal film deposition step is half the total film thickness of the first metal film 14 and the second metal film 15, a stress generated in the first metal film 14 can be alleviated as compared with the case where the first metal film 14 and the second metal film 15 are collectively formed. Furthermore, since the film thickness of the second metal film 15 formed by the second metal film deposition step is half the total film thickness of the first metal film 14 and the second metal film 15, a stress generated in the second metal film 15 can be alleviated as compared with the case where the first metal film 14 and the second metal film 15 are collectively formed. As a result, even if the total film thickness of the first metal film 14 and the second metal film 15 is increased in order to reduce the wiring line resistance of the gate layer including the gate electrode 16a, the light emission control line 16e, and the gate line 16g, a stress generated in the first metal film 14 and the second metal film 15 is alleviated, so that the occurrence of cracks in the underlying gate insulating film 13 can be suppressed. Thus, the wiring line resistance of the gate layer including the gate electrode 16a, the light emission control line 16e, and the gate line 16g can be reduced while the occurrence of cracks in the gate insulating film 13 is suppressed.

According to the organic EL display device 50 and the method for manufacturing the same of the present embodiment, since residues of the first metal film 14 remaining in the first etching step can be removed in the second etching step, for example, inter-wiring line leaks between the gate electrode 16a and the gate line 16g and between the gate electrode 16a and the light emission control line 16e having narrow intervals can be suppressed.

Second Embodiment

Figure 22:
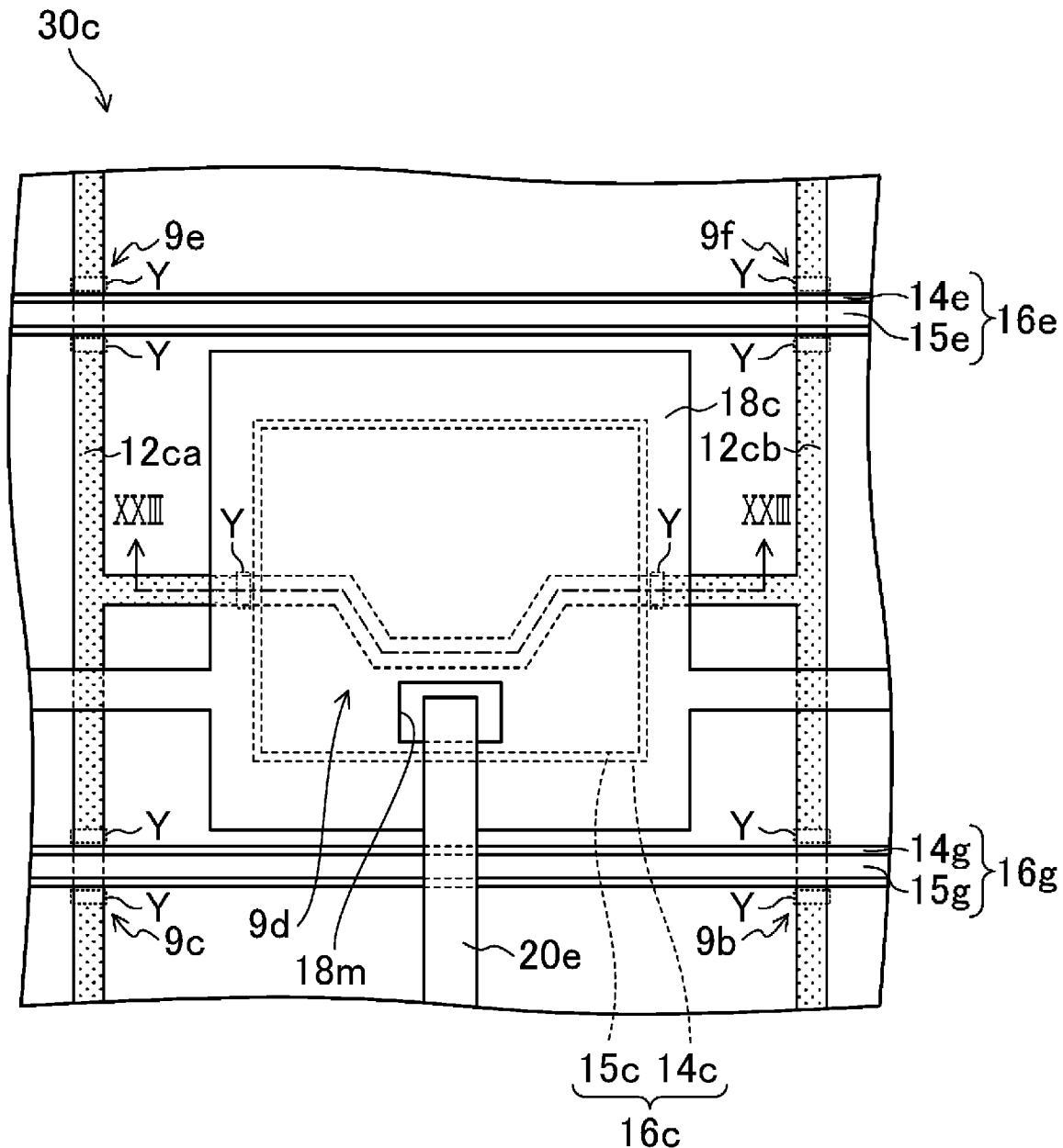
FIG. 22 is a plan view of a TFT layer included in an organic EL display device according to a second embodiment of the disclosure.
Figure 23:
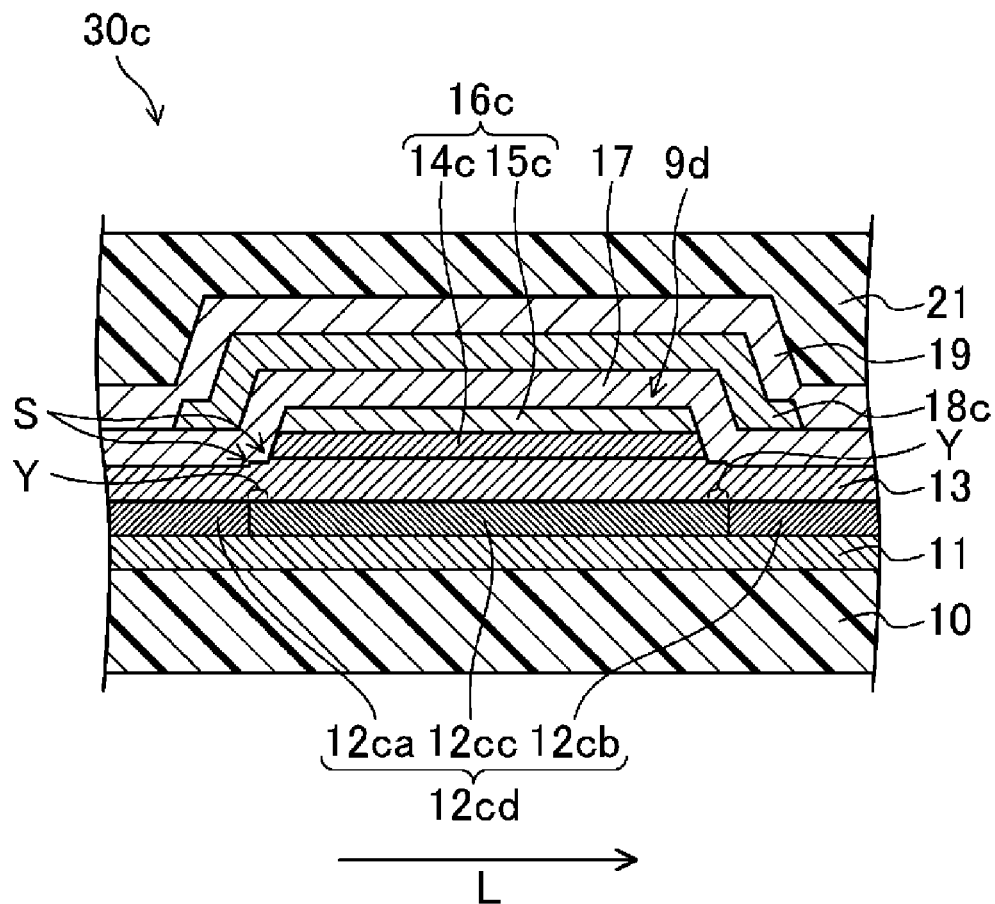
FIG. 23 is a cross-sectional view of the TFT layer taken along a line XXIII-XXIII in FIG. 22.

FIG. 22 to FIG. 28 illustrate a second embodiment of the display device and the method for manufacturing the same according to the disclosure. Here, FIG. 22 is a plan view of a TFT layer 30c included in an organic EL display device according to the present embodiment. FIG. 23 is a cross-sectional view of the TFT layer 30c taken along a line XXIII-XXIII in FIG. 22. Note that, in each of the following embodiments, the same portions as those in FIG. 1 to FIG. 21 are denoted by the same reference signs, and detailed description of these portions are omitted.

In the first embodiment described above, the organic EL display device 50 and the method for manufacturing the same, in which the conductor forming step is performed after the second etching step, are exemplified, but in the present embodiment, an organic EL display device and a method for manufacturing the same in which a conductor forming step is performed prior to the second metal film deposition step is exemplified.

Similar to the organic EL display device 50 of the first embodiment described above, the organic EL display device of the present embodiment includes the display region D and the frame region F provided on the periphery of the display region D. Similar to the organic EL display device 50 of the first embodiment described above, the organic EL display device of the present embodiment includes the resin substrate layer 10, the TFT layer 30c provided on the resin substrate layer 10, and the organic EL element layer 40 provided on the TFT layer 30c.

Similar to the TFT layer 30a of the organic EL display device 50 of the first embodiment described above, the TFT layer 30c includes the base coat film 11 provided on the resin substrate layer 10, the first initialization TFT 9a, the threshold voltage compensation TFT 9b, the write control TFT 9c, the drive TFT 9d, the power source supply TFT 9e, the light emission control TFT 9f, the second initialization TFT 9g, and the capacitor 9h provided for each subpixel P on the base coat film 11, and the flattening film 21 provided on each of the TFTs 9a to 9g and the capacitor 9h.

As illustrated in FIG. 23, the drive TFT 9d includes a semiconductor layer 12cd, the gate insulating film 13, the gate electrode 16c, the first interlayer insulating film 17, and the second interlayer insulating film 19, as well as the first terminal 20a (see FIG. 3) and the second terminal 20b (see FIG. 3), which are sequentially provided on the base coat film 11. Here, the semiconductor layer 12cd is formed of low-temperature polysilicon and is provided in a substantially H-shape on the base coat film 11, as illustrated in FIG. 22 and FIG. 23. As illustrated in FIG. 23, the semiconductor layer 12cd includes an intrinsic region 12cc provided to overlap with the gate electrode 16c in a plan view, and a pair of conductor regions 12ca and 12cb provided with an intrinsic region 12cc interposed therebetween. Note that, as illustrated in FIG. 22, the intrinsic region 12cc is provided with an intermediate portion thereof in a substantially V-shape in a plan view. As illustrated in FIG. 22 and FIG. 23, offset regions Y are provided in respective portions of the intrinsic region 12cc, the portions being on the respective sides with the pair of conductor regions 12ca and 12cb so as not to overlap with the first metal layer 14c and the second metal layer 15c described later. As illustrated in FIG. 23, the gate insulating film 13 is provided to cover the semiconductor layer 12cd. Note that, a step S having two steps along the circumferential end of the gate electrode 16c formed by first and second etching steps resides on the surface of the gate insulating film 13 exposed from the gate electrode 16a. The boundaries between the pair of conductor regions 12ca and 12cb and the intrinsic region 12cc are provided to align with the step S formed on the surface of the gate insulating film 13. As illustrated in 22, and 23, the gate electrode 16c is provided in a rectangle island shape in a plan view on the gate insulating film 13 to overlap with the intrinsic region 12cc of the semiconductor layer 12cd. As illustrated in FIG. 23, the gate electrode 16c includes a first metal layer 14c provided on the gate insulating film 13, and a second metal layer 15c provided on the first metal layer 14c. Note that as illustrated in FIG. 22 and FIG. 23, in a direction L (the horizontal direction in FIG. 22) of the channel length of the intrinsic region 12cc of the semiconductor layer 12cd and in a direction orthogonal thereto (the vertical direction in FIG. 22), the length of the second metal layer 15c is equal to or less than the length of the first metal layer 14c. The first metal layer 14c and the second metal layer 15c are formed of the same refractory metal, for example, tungsten, tantalum, molybdenum, niobium, titanium, molybdenum nitride, or the like. The intrinsic region 12cc of the semiconductor layer 12cd is provided to align with the first metal layer 14a serving as the first metal layer 14c. As illustrated in FIG. 23, the first interlayer insulating film 17 is provided to cover the gate electrode 16c, the light emission control line 16e, and the gate line 16g. As illustrated in FIG. 23, the second interlayer insulating film 19 is provided on the first interlayer insulating film 17 via the capacitance electrode 18c. The first terminal 20a and the second terminal 20b are electrically connected to the pair of the conductor regions 12ca and 12cb of the semiconductor layer 12cd via respective contact holes formed in a layered film of the gate insulating film 13, the first interlayer insulating film 17, and the second interlayer insulating film 19.

Note that the first initialization TFT 9a, the threshold voltage compensation TFT 9b, the write control TFT 9c, the power source supply TFT 9e, the light emission control TFT 9f, and the second initialization TFT 9g have similar configurations to that of the drive TFT 9d described above except that the capacitance electrode 18c is not interposed.

Similar to the organic EL display device 50 of the first embodiment described above, the organic EL display device including the TFT layer 30c having above-described configuration has flexibility and is configured to display an image by causing the light-emitting layer 3 of the organic EL layer 33 to emit light as appropriate via the first initialization TFT 9a, the threshold voltage compensation TFT 9b, the write control TFT 9c, the drive TFT 9d, the power source supply TFT 9e, the light emission control TFT 9f, and the second initialization TFT 9g in each subpixel P.

Next, a method for manufacturing the organic EL display device including the TFT layer 30c according to the present embodiment will be described. Note that the method for manufacturing the organic EL display device according to the present embodiment includes a TFT layer forming step in which a semiconductor layer forming step, a gate insulating film forming step, a first metal film deposition step, a first photo step, a first etching step, a first peeling step, a conductor forming step, a second metal film deposition step, a second photo step, a second etching step, and a second peeling step are sequentially performed, and an organic EL element layer forming step. Here, FIG. 24, FIG. 25, FIG. 26, and FIG. 27 are cross-sectional views illustrating the conductor forming step, the second metal film deposition step, the second photo step, and the second etching step, respectively, in the method for manufacturing the organic EL display device according to the present embodiment, where FIG. 24, FIG. 25, FIG. 26, and FIG. 27 are views corresponding to FIG. 23.

Figure 24:
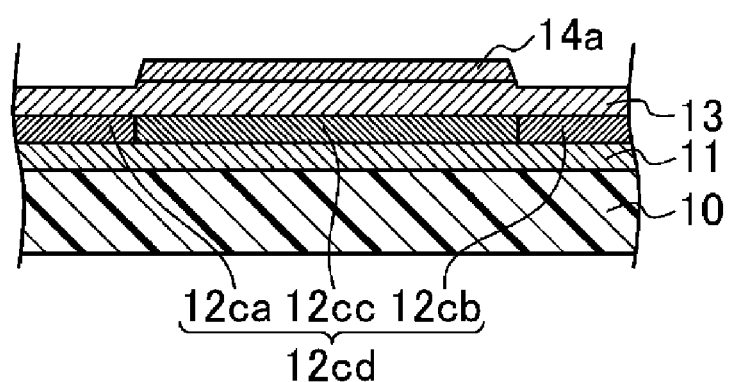
FIG. 24 is a cross-sectional view illustrating a conductor forming step in a method for manufacturing the organic EL display device according to the second embodiment of the disclosure, where

First, up to the first peeling step of the method for manufacturing the organic EL display device 50 described in the first embodiment above is performed, and subsequently by doping impurity ions into the semiconductor layer 12a and the like by using the first metal layer 14a as a mask, a portion of the semiconductor layer 12a and the like is made into electrically conductive to form the semiconductor layer 12cd including the conductor region 12ca, the conductor region 12cb, and the intrinsic region 12cc as illustrated in FIG. 24 (conductor forming step). Note that in the present embodiment, the method for manufacturing in which the conductor forming step is performed after the first peeling step is exemplified, but the conductor forming step may be performed before the first peeling step.

Figure 25:
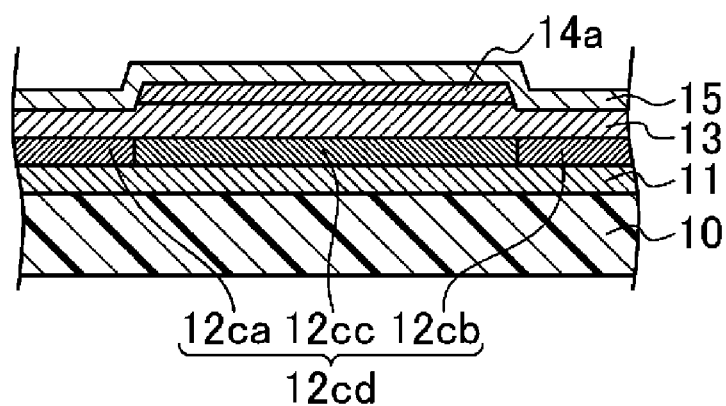
FIG. 25 is a cross-sectional view illustrating a second metal film deposition step in the method for manufacturing the organic EL display device according to the second embodiment of the disclosure, where

Next, a molybdenum film (a thickness of approximately 125 nm) is formed by, for example, a sputtering method to cover the first metal layer 14a and the like and the second metal film 15 is formed, as illustrated in FIG. 25 (second metal film deposition step).

Figure 26:
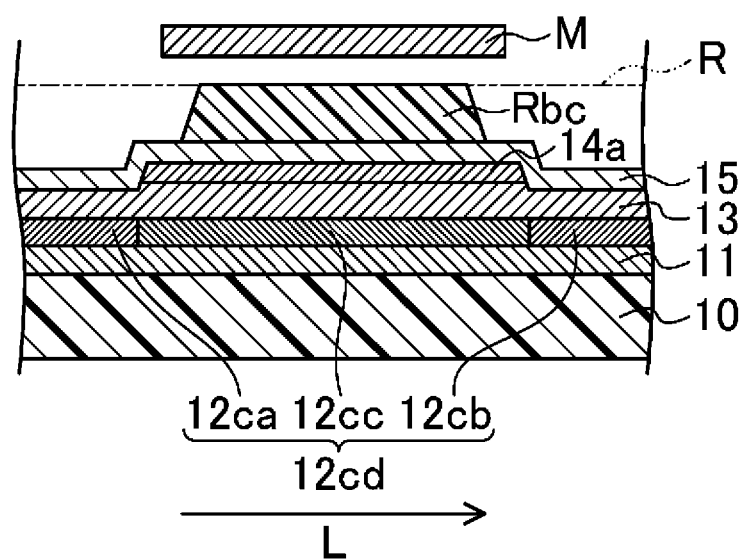
FIG. 26 is a cross-sectional view illustrating a second photo step in the method for manufacturing the organic EL display device according to the second embodiment of the disclosure, where

Thereafter, the resist R is applied on the second metal film 15, and subsequently, the resist R (dot-dash line in FIG. 26) is exposed using the second mask M to form the second resist pattern Rbc, as illustrated in FIG. 26 (second photo step). Here, by making the amount of exposure in the second photo step greater than the amount of exposure in the first photo step, as the second mask M, a mask common to the first mask M can be used. Note that in the direction L of the channel length of the semiconductor layer 12cd, the length of the second resist pattern Rbc is shorter than the length of the first resist pattern Ra.

Figure 27:
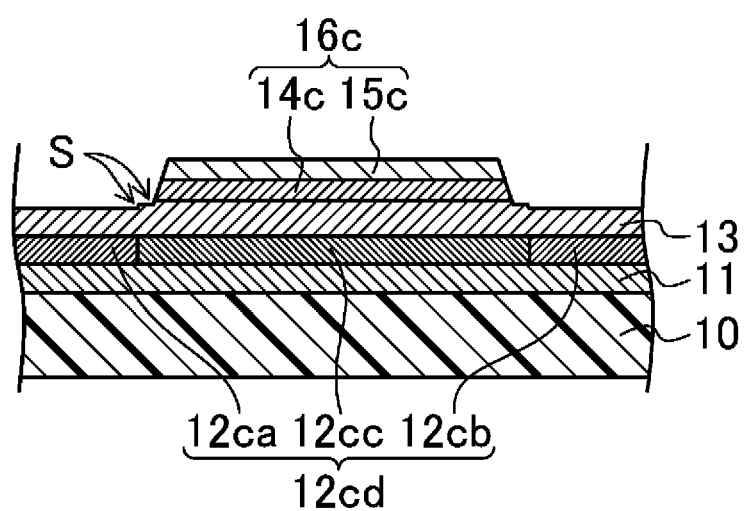
FIG. 27 is a cross-sectional view illustrating a second etching step in the method for manufacturing the organic EL display device according to the second embodiment of the disclosure, where

Furthermore, the second metal film 15 exposed from the second resist pattern Rbc is etched to form the second metal layer 15c and the like, to form the gate layer including the gate electrode 16c in which the first metal layer 14c and the second metal layer 15c are layered, as illustrated in FIG. 27 (second etching step). Here, in the second etching step, since the surface layer of the gate insulating film 13 underlying the second metal film 14 is also etched again, the step S having two steps is formed on the surface of the gate insulating film 13 as illustrated in FIG. 27.

Thereafter, the second resist pattern Rbc used in the second etching step is peeled (second peeling step), and subsequently, similar to the first embodiment described above, the first interlayer insulating film 17, the capacitance electrode 18c, the initialization power source line 18i, the connection wiring line 20e, the source line 20f, the power source line 20g, the flattening film 21, and the like are formed to form the TFT layer 30c, and subsequently the organic EL element layer forming step is performed, so that the organic EL display device including the TFT layer 30c can be manufactured.

Note that in the present embodiment, the organic EL display device including the TFT layer 30c and the method for manufacturing the same are exemplified, but may alternatively be an organic EL display device including a TFT layer 30d instead of the TFT layer 30c and a method for manufacturing the same. Here, FIG. 28 is a cross-sectional view of the TFT layer 30d constituting a modified example of the organic EL display device according to the present embodiment, where FIG. 28 is a view corresponding to FIG. 23.

In the TFT layer 30c of the present embodiment, the semiconductor layer 12cd and the like are formed of low-temperature polysilicon. In the TFT layer 30d of the modified example, however, a semiconductor layer 12dd and the like are formed of an oxide semiconductor. Thus, in the TFT layer 30d, only the cross-sectional shape of an underlying gate insulating film 13d of the semiconductor layer 12dd of each of the TFTs 9a to 9g, and accordingly the cross-sectional shape of the first interlayer insulating film 17b, the capacitance electrode 18cb, and the second interlayer insulating film 19b differ from that of the TFT layer 30c, and other configurations are substantially the same as those of the TFT layer 30c.

Figure 28:
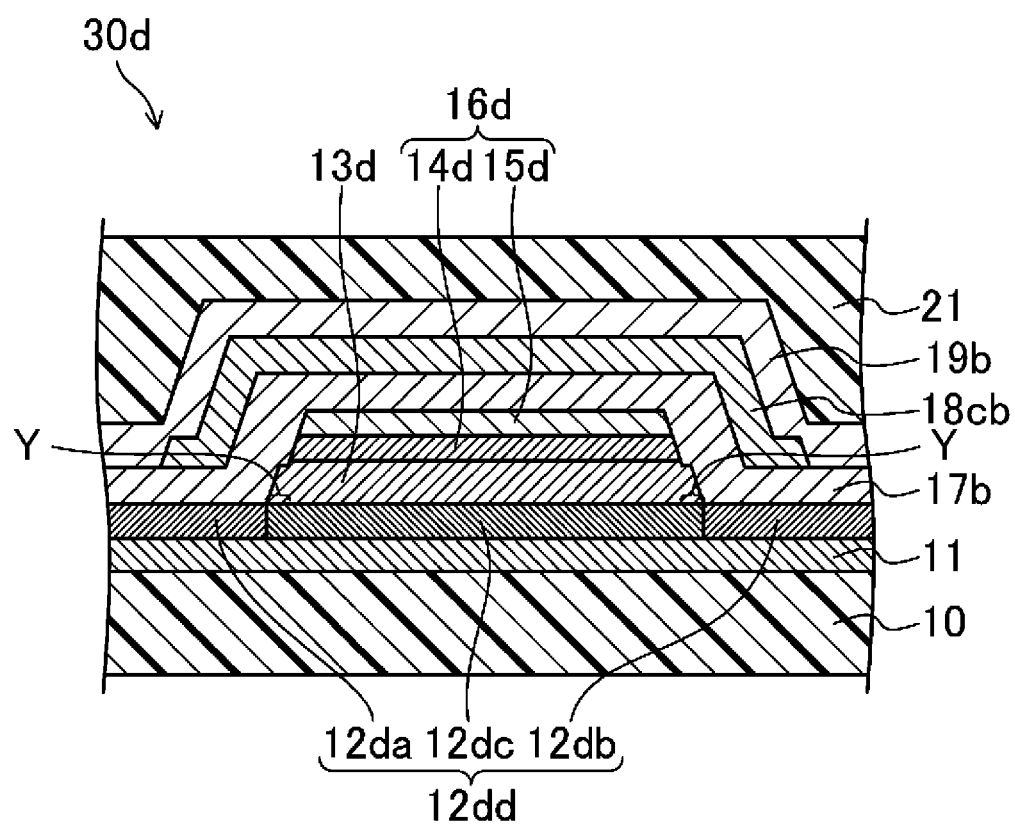
FIG. 28 is a cross-sectional view of the TFT layer constituting a modified example of the organic EL display device according to the second embodiment of the disclosure, where

Describing the drive TFT 9d representatively, as illustrated in FIG. 28, the drive TFT 9d includes the semiconductor layer 12dd, the gate insulating film 13d, a gate electrode 16d, the first interlayer insulating film 17b, and the second interlayer insulating film 19b, as well as the first terminal 20a (see FIG. 3) and the second terminal 20b (see FIG. 3), which are sequentially provided on the base coat film 11. Here, similar to the semiconductor layer 12cd, the semiconductor layer 12dd is provided in a substantially H-shape on the base coat film 11. Similar to the semiconductor layer 12cd, as illustrated in FIG. 28, the semiconductor layer 12dd includes an intrinsic region 12dc provided to overlap with the gate electrode 16b in a plan view, and a pair of conductor regions 12da and 12db provided with the intrinsic region 12dc interposed therebetween. Note that, similar to the intrinsic region 12cc, the intrinsic region 12dc is provided with an intermediate portion thereof in a substantially V-shape in a plan view. As illustrated in FIG. 28, offset regions Y are provided in respective portions of the intrinsic region 12dc, the portions being on respective sides with the pair of conductor regions 12da and 12db so as not to overlap with a first metal layer 14d and a second metal layer 15d described later. As illustrated in FIG. 28, the gate insulating film 13d is provided in an island shape to align with the gate electrode 16d, the light emission control line 16e, and the gate line 16g. The boundaries between the pair of conductor regions 12da and 12db and the intrinsic region 12dc are provided to align with the end portions of the gate insulating film 13d. As illustrated in FIG. 28, the gate electrode 16d is provided in a rectangle island shape in a plan view on the gate insulating film 13 to overlap with the intrinsic region 12dc of the semiconductor layer 12dd. As illustrated in FIG. 28, the gate electrode 16d includes the first metal layer 14d provided on the gate insulating film 13d, and a second metal layer 15d provided on the first metal layer 14d. Note that the first metal layer 14d and the second metal layer 15d are formed of the same refractory metal, for example, tungsten, tantalum, molybdenum, niobium, titanium, molybdenum nitride, or the like. As illustrated in FIG. 28, the first interlayer insulating film 17b is provided to cover the gate electrode 16d, the light emission control line 16e, and the gate line 16g. As illustrated in FIG. 28, the second interlayer insulating film 19b is provided on the first interlayer insulating film 17b via the capacitance electrode 18cb.

The organic EL display device including the TFT layer 30d described above can be manufactured by combining the method for manufacturing of the present embodiment and the method for manufacturing of the above-described modified example of the first embodiment.

As described above, according to the organic EL display device and the method for manufacturing the same of the present embodiment, the first metal layer 14a formed by the first metal film deposition step, the first photo step, and the first etching step, and the second metal layer 15a formed by the second metal film deposition step, the second photo step, and the second etching step are layered on the gate insulating film 13 to form a gate layer including the gate electrode 16c of the TFT layer 30c. Here, since the film thickness of the first metal film 14 formed by the first metal film deposition step is half the total film thickness of the first metal film 14 and the second metal film 15, a stress generated in the first metal film 14 can be alleviated as compared with the case where the first metal film 14 and the second metal film 15 are collectively formed. Furthermore, since the film thickness of the second metal film 15 formed by the second metal film deposition step is half the total film thickness of the first metal film 14 and the second metal film 15, a stress generated in the second metal film 15 can be alleviated as compared with the case where the first metal film 14 and the second metal film 15 are collectively formed. As a result, even if the total film thickness of the first metal film 14 and the second metal film 15 is increased in order to reduce the wiring line resistance of the gate layer including the gate electrode 16c, the stress generated in the first metal film 14 and the second metal film 15 is alleviated, so that the occurrence of cracks in the underlying gate insulating film 13 can be suppressed. Thus, the wiring line resistance of the gate layer including the gate electrode 16c can be reduced while the occurrence of cracks in the gate insulating film 13 is suppressed.

According to the organic EL display device and the method for manufacturing the same of the present embodiment, since residues of the first metal film 14 remaining in the first etching step can be removed in the second etching step, for example, inter-wiring line leaks between the gate electrode 16c and the gate line 16g and between the gate electrode 16c and the light emission control line 16e having narrow intervals can be suppressed.

According to the organic EL display device and the method for manufacturing the same of the present embodiment, since the organic EL display device of the present embodiment includes the TFTs 9a to 9g having the offset regions Y, an S value (a rising coefficient in a subthreshold region) of the TFTs 9a to 9g can be increased, and a leakage current can be reduced.

Third Embodiment

Figure 29:
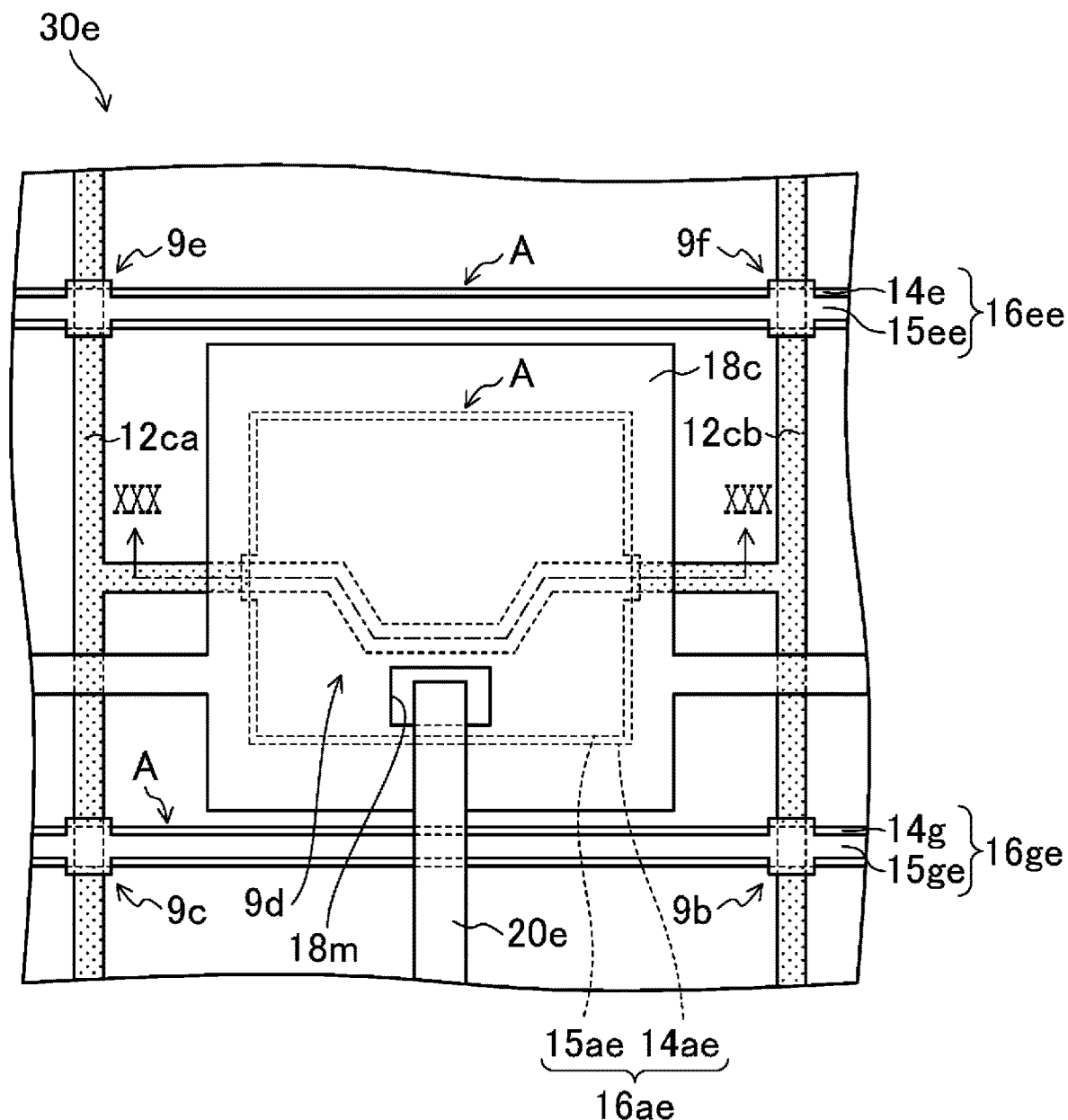
FIG. 29 is a plan view of a TFT layer included in an organic EL display device according to a third embodiment of the disclosure.
Figure 30:
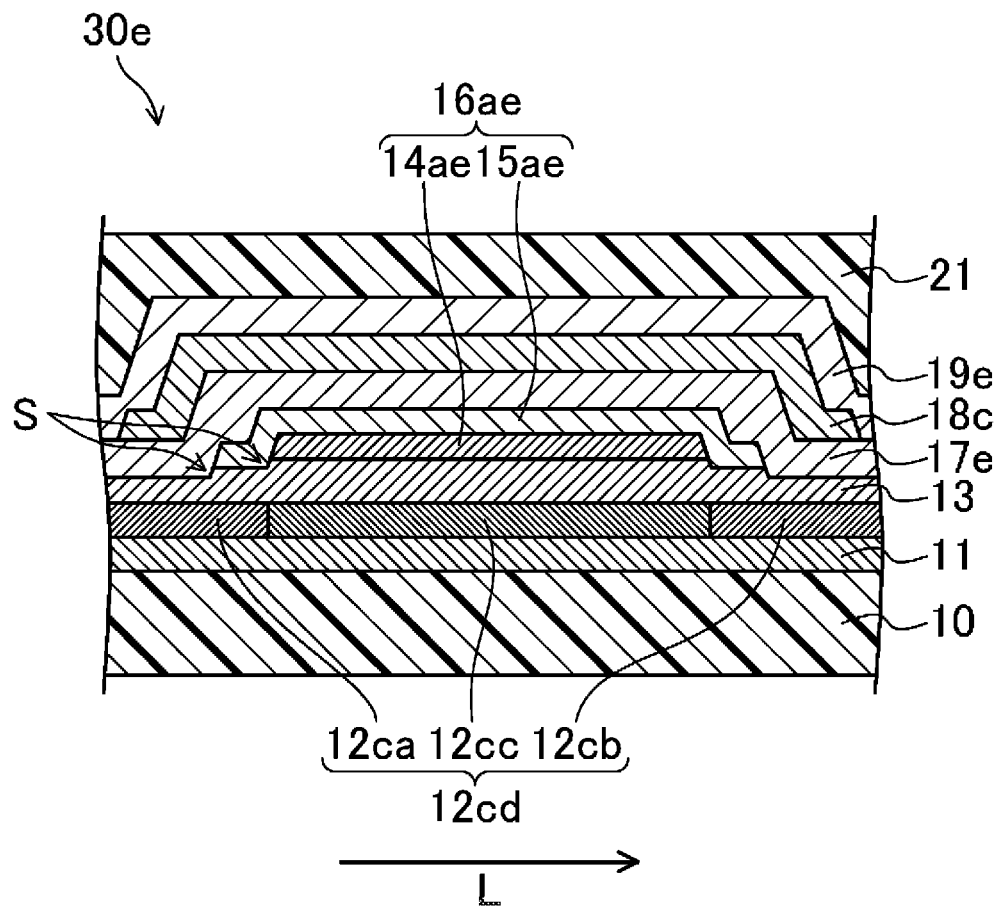
FIG. 30 is a cross-sectional view of the TFT layer taken along a line XXX-XXX in FIG. 29.

FIG. 29 to FIG. 32 illustrate a third embodiment of the display device and the method for manufacturing the same according to the disclosure. Here, FIG. 29 is a plan view of a TFT layer 30e included in an organic EL display device according to the third embodiment of the disclosure. FIG. 30 is a cross-sectional view of the TFT layer 30e taken along a line XXX-XXX in FIG. 29.

In the first and second embodiments, the organic EL display device including any of the TFT layers 30a to 30d provided such that the side surface of the second metal layer and the side surface of the first metal layer align with each other in the gate electrodes of the TFTs is exemplified. In the present embodiment, however, an organic EL display device including the TFT layer 30e provided such that a portion of a second metal layer 15ae protrudes from an end portion of a first metal layer 14ae in the gate electrode of the TFT is exemplified.

Similar to the organic EL display device 50 of the first embodiment described above, the organic EL display device of the present embodiment includes the display region D and the frame region F provided on the periphery of the display region D. Similar to the organic EL display device 50 of the first embodiment described above, the organic EL display device of the present embodiment includes the resin substrate layer 10, the TFT layer 30e provided on the resin substrate layer 10, and the organic EL element layer 40 provided on the TFT layer 30e.

Similar to the TFT layer 30a of the organic EL display device 50 of the first embodiment described above, the TFT layer 30e includes the base coat film 11 provided on the resin substrate layer 10, the first initialization TFT 9a, the threshold voltage compensation TFT 9b, the write control TFT 9c, the drive TFT 9d, the power source supply TFT 9e, the light emission control TFT 9f, the second initialization TFT 9g, and the capacitor 9h provided for each subpixel P on the base coat film 11, and the flattening film 21 provided on each of the TFTs 9a to 9g and the capacitor 9h.

Figure 31:
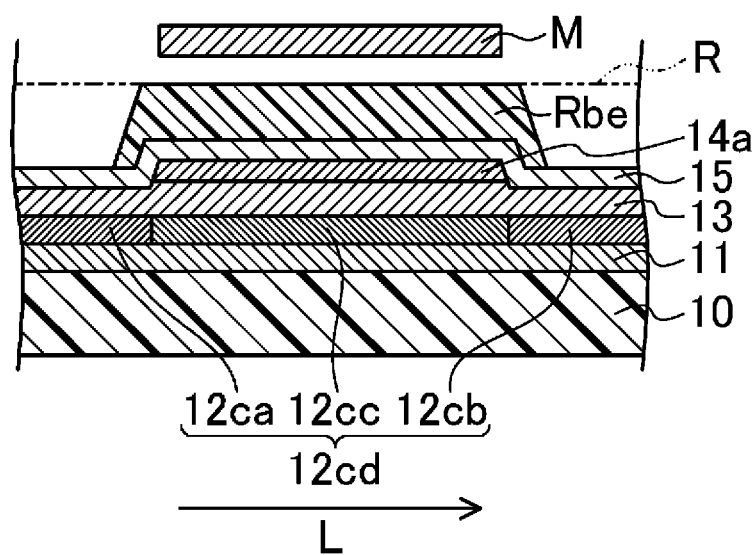
FIG. 31 is a cross-sectional view illustrating a second photo step in a method for manufacturing the organic EL display device according to the third embodiment of the disclosure, where

As illustrated in FIG. 30, the drive TFT 9d includes the semiconductor layer 12cd, the gate insulating film 13, a gate electrode 16ae, a first interlayer insulating film 17e, a second interlayer insulating film 19e, as well as the first terminal 20a (see FIG. 3) and the second terminal 20b (see FIG. 3), which are sequentially provided on the base coat film 11. Here, the semiconductor layer 12cd is formed of low-temperature polysilicon and is provided in a substantially H-shape on the base coat film 11, as illustrated in FIG. 29 and FIG. 30. As illustrated in FIG. 30, the semiconductor layer 12cd includes the intrinsic region 12cc provided to overlap with the gate electrode 16ae in a plan view, and the pair of conductor regions 12ca and 12cb provided with the intrinsic region 12cc interposed therebetween. Note that, as illustrated in FIG. 29, the intrinsic region 12*cc* is provided with an intermediate portion thereof in a substantially V-shape in a plan view. As illustrated in FIG. 30, the gate insulating film 13 is provided to cover the semiconductor layer 12*cd*. Note that the boundaries between the pair of conductor regions 12*ca* and 12*cb* and the intrinsic region 12*cc* are provided to align with the end portions of the first metal layer 14*ae* of the gate electrode 16*ae* as illustrated in FIG. 30. As illustrated in FIG. 29 and FIG. 31, the gate electrode 16*ae* is provided in a rectangle island shape in a plan view on the gate insulating film 13 to overlap with the intrinsic region 12*cc* of the semiconductor layer 12*cd*. As illustrated in FIG. 30, the gate electrode 16*ae* includes the first metal layer 14*ae* provided on the gate insulating film 13, and the second metal layer 15*ae* provided on the first metal layer 14*ae*. Note that, in the portion of the gate electrode 16*ae* overlapping with the intrinsic region 12*cc*, the second metal layer 15*ae* is provided to protrude from both end portions of the first metal layer 14*ae* to cover the first metal layer 14*ae* in a direction L of the channel length of the semiconductor layer 12*cd*, as illustrated in FIG. 29 and FIG. 30. A portion A of the gate electrode 16*ae* that does not overlap with the semiconductor layer 12*cd* is provided such that the width of the second metal layer 15*ae* is equal to or less than the width of the first metal layer 14*ae*, as illustrated in FIG. 29. The portion A of the light emission control line 16*ee* that does not overlap with the semiconductor layer 12*cd* is provided such that the width of the second metal layer 15*ee* is equal to or less than the width of the first metal layer 14*e*, as illustrated in FIG. 29. The portion A of a gate line 16*ge* that does not overlap with the semiconductor layer 12*cd* is provided such that the width of a second metal layer 15*ge* is equal to or less than the width of the first metal layer 14*g*, as illustrated in FIG. 29. The first metal layer 14*ae* and the second metal layer 15*ae* are formed of the same refractory metal, for example, tungsten, tantalum, molybdenum, niobium, titanium, molybdenum nitride, or the like. The intrinsic region 12*cc* of the semiconductor layer 12*cd* is provided to align with the first metal layer 14*ae*. As illustrated in FIG. 30, the first interlayer insulating film 17*e* is provided to cover the gate electrode 16*ae*, the light emission control line 16*ee*, and the gate line 16*ge*. As illustrated in FIG. 30, the second interlayer insulating film 19*e* is provided on the first interlayer insulating film 17*e* via the capacitance electrode 18*c*. The first terminal 20*a* and the second terminal 20*b* are electrically connected to the pair of the conductor regions 12*ca* and 12*cb* of the semiconductor layer 12*cd*, respectively, via respective contact holes formed in a layered film of the gate insulating film 13, the first interlayer insulating film 17*e*, and the second interlayer insulating film 19*e*.

Note that the first initialization TFT 9*a*, the threshold voltage compensation TFT 9*b*, the write control TFT 9*c*, the power source supply TFT 9*e*, the light emission control TFT 9*f*, and the second initialization TFT 9*g* have similar configurations to that of the drive TFT 9*d* described above except that the capacitance electrode 18*c* is not interposed.

Similar to the organic EL display device 50 of the first embodiment described above, the organic EL display device including the TFT layer 30*e* having above-describe configuration has flexibility and is configured to display an image by causing the light-emitting layer 3 of the organic EL layer 33 to emit light as appropriate via the first initialization TFT 9*a*, the threshold voltage compensation TFT 9*b*, the write control TFT 9*c*, the drive TFT 9*d*, the power source supply TFT 9*e*, the light emission control TFT 9*f*, and the second initialization TFT 9*g* in each subpixel P.

Figure 32:
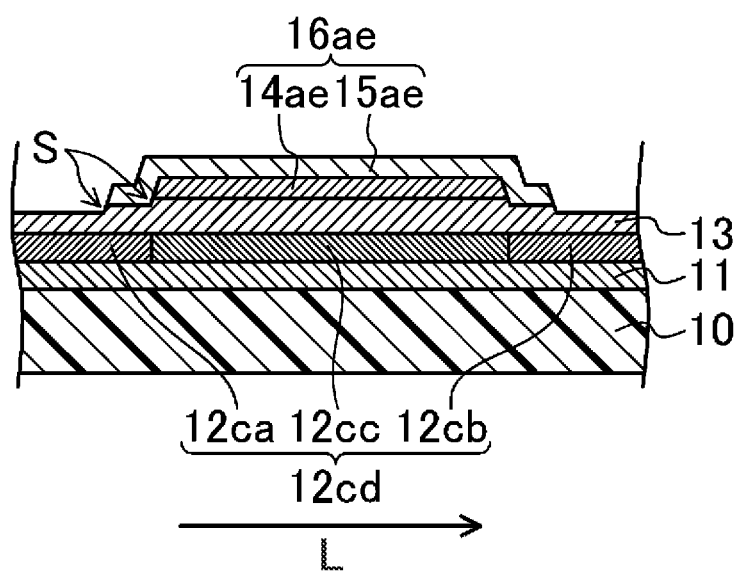
FIG. 32 is a cross-sectional view illustrating a second etching step in the method for manufacturing the organic EL display device according to the third embodiment of the disclosure, where

Next, a method for manufacturing the organic EL display device including the TFT layer 30*e* according to the present embodiment will be described. Note that the method for manufacturing the organic EL display device according to the present embodiment includes a TFT layer forming step in which a semiconductor layer forming step, a gate insulating film forming step, a first metal film deposition step, a first photo step, a first etching step, a first peeling step, a conductor forming step, a second metal film deposition step, a second photo step, a second etching step, and a second peeling step are sequentially performed, and an organic EL element layer forming step. Here, FIG. 31 and FIG. 32 are cross-sectional views illustrating the second photo step and the second etching step, respectively, in the method for manufacturing the organic EL display device according to the present embodiment, where FIG. 31 and FIG. 32 are views corresponding to FIG. 30.

First, up to the first peeling step of the method for manufacturing the organic EL display device 50 described in the first embodiment above is performed, and subsequently by doping impurity ions into the semiconductor layer 12*a* and the like by using the first metal layer 14*a* as a mask, a portion of the semiconductor layer 12*a* and the like is made into electrically conductive to form the semiconductor layer 12*cd* including the conductor region 12*ca*, the conductor region 12*cb*, and the intrinsic region 12*cc* as illustrated in FIG. 24 (conductor forming step). Note that in the present embodiment, the method for manufacturing in which the conductor forming step is performed after the first peeling step is exemplified, but the conductor forming step may be performed before the first peeling step.

Next, a molybdenum film (a thickness of approximately 125 nm) is formed by, for example, a sputtering method to cover the first metal layer 14*a* and the like to form the second metal film 15, as illustrated in FIG. 25 (second metal film deposition step).

Thereafter, the resist R (dot-dash line in FIG. 31) is applied on the second metal film 15, and subsequently, the resist R is exposed using the second mask M to form a second resist pattern Rbe, as illustrated in FIG. 31 (second photo step). Here, in the second photo step, the second resist pattern Rbe is formed to protrude from both end portions of the first metal layer 14*a* in a direction L of the channel length of the semiconductor layer 12*cd*.

Furthermore, the second metal film 15 exposed from the second resist pattern Rbe is etched to form the second metal layers 15*ae*, 15*ee*, 15*gef*, and the like, as illustrated in FIG. 32, and to form the gate layer including the gate electrode 16*ae*, the light emission control line 16*ee*, and the gate line 16*ge* in which the first metal layer 14*a*, 14*e*, and 14*g* and the second metal layers 15*ae*, 15*ee*, and 15*ge* are layered, respectively (second etching step). Here, in the second etching step, the second metal layer 15*ae* is formed to cover the both end portions of the first metal layer 14*ae* and between the both end portions in the direction L of the channel length of the semiconductor layer 12*cd*. In the second etching step, since the surface layer of the gate insulating film 13 underlying the second metal film 14 is also etched again, the step S having two steps is formed on the surface of the gate insulating film 13 as illustrated in FIG. 32.

Thereafter, the second resist pattern Rbe used in the second etching step is peeled (second peeling step), and subsequently similar to the first embodiment described above, the first interlayer insulating film 17, the capacitance electrode 18*c*, the initialization power source line 18*i*, the connection wiring line 20*e*, the source line 20*f*, the power source line 20g, and the flattening film 21 and the like are formed to form the TFT layer 30e, and subsequently the organic EL element layer forming step is performed, so that the organic EL display device including the TFT layer 30e can be manufactured.

As described above, according to the organic EL display device and the method for manufacturing the same of the present embodiment, the first metal layer 14ae formed by the first metal film deposition step, the first photo step, and the first etching step, and the second metal layer 15ae formed by the second metal film deposition step, the second photo step, and the second etching step are layered on the gate insulating film 13 to form the gate layer including the gate electrode 16ae of the TFT layer 30e. Here, since the film thickness of the first metal film 14 formed by the first metal film deposition step is half the total film thickness of the first metal film 14 and the second metal film 15, a stress generated in the first metal film 14 can be alleviated as compared with the case where the first metal film 14 and the second metal film 15 are collectively formed. Furthermore, since the film thickness of the second metal film 15 formed by the second metal film deposition step is half the total film thickness of the first metal film 14 and the second metal film 15, a stress generated in the second metal film 15 can be alleviated as compared with the case where the first metal film 14 and the second metal film 15 are collectively formed. As a result, even if the total film thickness of the first metal film 14 and the second metal film 15 is increased in order to reduce the wiring line resistance of the gate layer including the gate electrode 16ae, the stress generated in the first metal film 14 and the second metal film 15 is alleviated, so that the occurrence of cracks in the underlying gate insulating film 13 can be suppressed. Thus, the wiring line resistance of the gate layer including the gate electrode 16ae can be reduced while the occurrence of cracks in the gate insulating film 13 is suppressed.

According to the organic EL display device and the method for manufacturing the same of the present embodiment, since residues of the first metal film 14 remaining in the first etching step can be removed in the second etching step, for example, inter-wiring line leaks between the gate electrode 16ae and the gate line 16ge and between the gate electrode 16ae and the light emission control line 16ee having narrow intervals can be suppressed.

According to the organic EL display device and the method for manufacturing the same of the present embodiment, the boundaries between the pair of conductor regions 12ca and 12cb and the intrinsic region 12cc are provided to align with the end portions of the first metal layer 14a of the gate electrode 16ae, and the second metal layer 15ae of the gate electrode 16ae is provided to protrude from the both end portions of the first metal layer 14a to cover the first metal layer 14a in the direction L of the channel length of the semiconductor layer 12cd, so that the TFTs 9a to 9g having no offset region Y can be formed.

Note that in the present embodiment, the configuration in which the semiconductor layer is formed of low-temperature polysilicon is exemplified, but the present invention is also applicable to the case where the semiconductor layer is formed of the oxide semiconductor layer. In this case, the gate insulating film does not align with the end portions of the gate electrode, and is provided entirely on the base coat layer or the semiconductor layer except for contact holes and the like, as is the case where the semiconductor layer is formed of low-temperature polysilicon. Here, the conductor forming process is performed via the gate insulating film. Furthermore, the shapes of the step formed in the gate insulating film, and the intrinsic region and the conductor region of the semiconductor layer are similar to those in the case where the semiconductor layer is formed of the low-temperature polysilicon.

Fourth Embodiment

Figure 33:
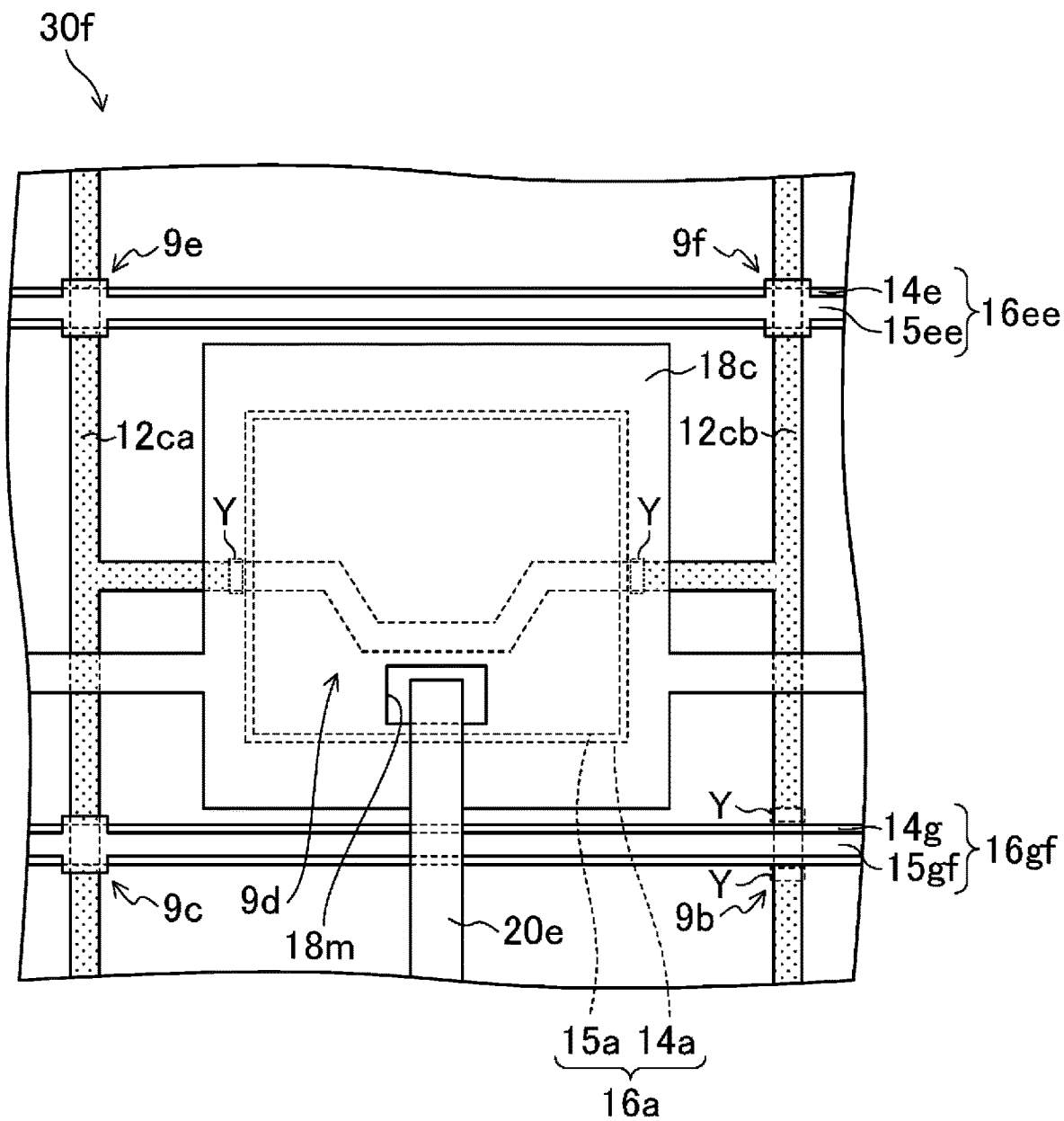
FIG. 33 is a plan view of a TFT layer included in an organic EL display device according to a fourth embodiment of the disclosure.

FIG. 33 illustrates a fourth embodiment of the display device and the method for manufacturing the same according to the disclosure. Here, FIG. 33 is a plan view of a TFT layer 30f included in an organic EL display device of the present embodiment.

The above-described second embodiment exemplifies the organic EL display device including the TFT layer 30c provided with TFTs 9a to 9g having the offset region Y, and the above-described third embodiment exemplifies the organic EL display device including the TFT layer 30e provided with the TFTs 9a to 9g having no offset regions Y. The present embodiment exemplifies an organic EL display device including the TFT layer 30f combining the TFTs 9a, 9b, and 9d having the offset regions Y and the TFTs 9c, 9e, 9f, and 9g having no offset region Y.

Specifically, in a case where a TFT having the offset region Y is defined as a first TFT and a TFT having no offset region Y is defined as a second TFT, the organic EL display device may include the TFT layer 30f provided with the first initialization TFT 9a (not illustrated), the threshold voltage compensation TFT 9b, and the drive TFT 9d as the first TFTs, and provided with the write control TFT 9c, the power source supply TFT 9e, the light emission control TFT 9f, and the second initialization TFT 9g (not illustrated) as the second TFTs, as illustrated in FIG. 33.

Here, in the first TFTs (9a, 9b, and 9d) including the first semiconductor layer including the first intrinsic region and the pair of first conductor regions and the first gate layer, as illustrated in FIG. 23, the offset regions Y are provided in respective portions of the first intrinsic region 12cc, the portions being respective sides with the pair of first conductor regions 12ca and 12cb, so as not to overlap with the first metal layer 14a and the second metal layer 15a, boundaries between the pair of first conductor regions 12ca and 12cb and the first intrinsic region 12cc are provided to align with the step S formed on the surface of the gate insulating film 13, and the length of the second metal layer 15a is equal to or less than the length of the first metal layer 14a in the direction L of a channel length of the first semiconductor layer 12cd.

In the second TFTs (9c, 9e, 9f, and 9g) including the second semiconductor layer including the second intrinsic region and the pair of second conductor regions and the second gate layer, as illustrated in FIG. 33 (see FIG. 30), boundaries between the pair of second conductor regions 12ca and 12cb and the second intrinsic region 12cc are provided to align with the end portions of the first metal layers 14e and 14g, and in the second gate layer (the light emission control line 16ee and the gate line 16gf) overlapping with the second intrinsic region 12cc, the second metal layers 15ee and 15gf are provided to protrude from both end portions of the first metal layers 14e and 14g to cover the first metal layers 14e and 14g, in the direction L of the channel length of the second semiconductor layer 12cd. The portion of the second gate layer (the light emission control line 16ee and the gate line 16gf) that does not overlap with the second intrinsic region 12cc is provided such that the width of the second metal layers 15ee and 15gf is equal to or less than the width of the first metal layers 14e and 14g, as illustrated in FIG. 33.

Note that in the present embodiment, the configuration in which the semiconductor layer is formed of the low-temperature polysilicon is exemplified. The semiconductor layer, however, may be formed of the oxide semiconductor layer.

Other Embodiments

In each of the embodiments described above, the organic EL layer having a five-layered structure including the hole injection layer, the hole transport layer, the light-emitting layer, the electron transport layer, and the electron injection layer is exemplified, but the organic EL layer may have a three-layered structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device including a top gate type TFT is exemplified, but the disclosure is also applicable to an organic EL display device including a bottom gate type TFT.

In each of the embodiments described above, the organic EL display device 50 including the sealing film 39 provided with the sealing organic film 37 between the first sealing inorganic insulating film 36 and the second sealing inorganic insulating film 38 is exemplified. The disclosure is also applicable to an organic EL display device in which an organic vapor deposition film is formed between the first sealing inorganic insulating film 36 and the second sealing inorganic insulating film 38, and subsequently the organic vapor deposition film is ashed to cover the foreign matters with the organic vapor deposition film. According to such a configuration of the sealing film, even if the foreign matters are present on the display region, the sealing performance can be ensured by the second sealing inorganic insulating film, and the reliability can be improved.

In addition, in each of the embodiments described above, the organic EL display device is exemplified and described as the display device. The disclosure is, however, not limited to the organic EL display device and also applicable to any flexible display device. For example, the disclosure is applicable to a flexible display device including QLEDs or the like that are light-emitting elements using a quantum dot containing layer.

INDUSTRIAL APPLICABILITY

As described above, the disclosure is useful for a flexible display device.

The invention claimed is:

1. A display device comprising:
a resin substrate;
a thin film transistor layer provided on the resin substrate and including a thin film transistor arranged for each of a plurality of subpixels; and
a light-emitting element layer provided on the thin film transistor layer and including a light-emitting element arranged for each of the plurality of subpixels,
wherein a semiconductor layer formed of low-temperature polysilicon, a gate insulating film, and a gate layer are sequentially provided as the thin film transistor layer on the resin substrate,
the gate layer includes a first metal layer provided on the gate insulating film and a second metal layer provided on the first metal layer,
the semiconductor layer includes an intrinsic region provided to overlap with the first metal layer and a pair of conductor regions provided with the intrinsic region interposed therebetween,
boundaries between the pair of conductor regions and the intrinsic region are provided to align with end portions of the first metal layer,
in the gate layer overlapping with the intrinsic region, the second metal layer is further provided to protrude from both of the end portions of the first metal layer to cover the first metal layer in a direction of a channel length of the semiconductor layer, and
the gate layer that does not overlap with the semiconductor layer includes a portion in which a width of the second metal layer is equal to or less than a width of the first metal layer.

2. A display device comprising:
a resin substrate;
a thin film transistor layer provided on the resin substrate and including a thin film transistor arranged for each of a plurality of subpixels; and
a light-emitting element layer provided on the thin film transistor layer and including a light-emitting element arranged for each of the plurality of subpixels,
wherein a semiconductor layer, a gate insulating film, and a gate layer are sequentially provided as the thin film transistor layer on the resin substrate,
the thin film transistor includes a first thin film transistor and a second thin film transistor,
the semiconductor layer includes a first semiconductor layer and a second semiconductor layer provided to correspond to the first thin film transistor and the second thin film transistor,
the gate layer includes a first gate layer and a second gate layer provided to correspond to the first thin film transistor and the second thin film transistor,
the first gate layer and the second gate layer respectively include a first metal layer provided on the gate insulating film and a second metal layer provided on the first metal layer,
the first semiconductor layer includes a first intrinsic region provided to overlap with the first gate layer and a pair of first conductor regions provided with the first intrinsic region interposed therebetween,
offset regions are provided in respective portions of the first intrinsic region, the respective portions being respective sides, with the pair of conductor regions not overlapping the corresponding first metal layer and the second metal layer,
boundaries between the pair of first conductor regions and the first intrinsic region are provided to align with a step formed on a surface of the gate insulating film,
a length of the corresponding second metal layer is equal to or less than a length of the corresponding first metal layer in a direction of a channel length of the first semiconductor layer,
the second semiconductor layer includes a second intrinsic region provided to overlap with the corresponding first metal layer, and a pair of second conductor regions provided with the second intrinsic region interposed therebetween, boundaries between the pair of second conductor regions and the second intrinsic region are provided to align with end portions of the corresponding first metal layer,
in the second gate layer overlapping with the second intrinsic region, the corresponding second metal layer is provided to protrude from both of the end portions of the corresponding first metal layer to cover the first metal layer in a direction of a channel length of the second semiconductor layer, and
the second gate layer not overlapping with the second semiconductor layer includes a portion in which a width of the corresponding second metal layer is equal to or less than a width of the corresponding first metal layer.

3. The display device according to claim 2,
wherein the thin film transistor layer further includes a first inorganic insulating film provided on the gate layer, an intermediate metal layer provided on the first inorganic insulating film, a second inorganic insulating film provided on the intermediate metal layer, and a source layer provided on the second inorganic insulating film,
the gate layer further includes a gate line and a light emission control line,
the source layer includes a source line and a power source line,
each of the plurality of subpixels is provided with a drive thin film transistor, a write control thin film transistor, a threshold voltage compensation thin film transistor, and a light emission control thin film transistor, each of the drive thin film transistor, the write control thin film transistor, the threshold voltage compensation thin film transistor, and the light emission control thin film transistor including a first terminal, a second terminal, and a control terminal, and a capacitor including a lower electrode and an upper electrode,
the drive thin film transistor is provided to control a current amount of the light-emitting element,
in the write control thin film transistor, the control terminal is electrically connected to the gate line, the first terminal is electrically connected to the source line, and the second terminal is electrically connected to the first terminal of the drive thin film transistor,
in the threshold voltage compensation thin film transistor, the control terminal is electrically connected to the gate line, the first terminal is electrically connected to the second terminal of the drive thin film transistor, and the second terminal is electrically connected to the control terminal of the drive thin film transistor,
in the light emission control thin film transistor, the control terminal is electrically connected to the light emission control line, the first terminal is electrically connected to the second terminal of the drive thin film transistor, and the second terminal is electrically connected to the light-emitting element, and
in the capacitor, the lower electrode provided as the gate layer is electrically connected to a control terminal of the drive thin film transistor, and the upper electrode provided as the intermediate metal layer is electrically connected to the power source line.

4. The display device according to claim 3,
wherein the first thin film transistor is the drive thin film transistor.

5. The display device according to claim 3,
wherein the first thin film transistor is the threshold voltage compensation thin film transistor.

6. The display device according to claim 3,
wherein the second thin film transistor is the write control thin film transistor.

7. The display device according to claim 3,
wherein the gate line and the lower electrode are provided to be arranged side by side with each other in each of the plurality of subpixels, and
a distance between the first metal layer of the gate line and the first metal layer of the lower electrode arranged side by side with each other is shorter than a distance between the second metal layer of the gate line and the second metal layer of the lower electrode arranged side by side with each other.

8. The display device according to claim 7,
wherein an end portion on a side with the gate line of the upper electrode is arranged, in a plan view, between the first metal layer of the gate line and the first metal layer of the lower electrode arranged side by side with each other.

9. The display device according to claim 3,
wherein the light emission control line and the lower electrode are provided to be arranged side by side with each other in each of the plurality of subpixels, and
a distance between the first metal layer of the light emission control line and the first metal layer of the lower electrode arranged side by side with each other is shorter than a distance between the second metal layer of the light emission control line and the second metal layer of the lower electrode arranged side by side with each other.

* * * * *